(12) United States Patent
Wang et al.

(10) Patent No.: US 12,235,303 B2
(45) Date of Patent: Feb. 25, 2025

(54) DOUBLE-BALANCE ELECTRONIC TEST APPARATUS AND MEASURING INDUCTANCE, CAPACITANCE, AND RESISTANCE

(71) Applicant: Government of the United States of America, as represented by the Secretary of Commerce, Gaithersburg, MD (US)

(72) Inventors: Yicheng Wang, Germantown, MD (US); Bryan Christopher Waltrip, Frederick, MD (US); Stephan Schlamminger, Silver Spring, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 147 days.

(21) Appl. No.: 18/128,055

(22) Filed: Mar. 29, 2023

(65) Prior Publication Data

US 2023/0349961 A1    Nov. 2, 2023

Related U.S. Application Data

(60) Provisional application No. 63/327,137, filed on Apr. 4, 2022.

(51) Int. Cl.
*G01R 35/00* (2006.01)
*G01R 27/30* (2006.01)

(52) U.S. Cl.
CPC ........... *G01R 27/30* (2013.01); *G01R 35/005* (2013.01)

(58) Field of Classification Search
None
See application file for complete search history.

(56) References Cited

U.S. PATENT DOCUMENTS 8,831,898 B2 *   9/2014  Pinter ................... A61B 5/053
                                                      702/65
10,509,064 B2 * 12/2019  Fan ........................ G01R 27/04

OTHER PUBLICATIONS

Keysight Technologies, "Impedance Measurement Handbook", A Guide to Measurement Technology and Techniques 6th Edition, p. 1-153, Accessed online: Feb. 24, 2023, DOI: https://www.keysight.com/us/en/assets/7018-06840/application-notes/5950-3000.pdf.
Keysight Technologies, "Keysight E4980A/AL Precision LCR Meter", p. 1-519, Accessed online: Feb. 24, 2023, DOI: https://www.keysight.com/us/en/assets/9018-06166/user-manuals/9018-06166.pdf.
Maeda, K., "An Automatic, Precision 1-MHz Digital LCR Meter", Hewlett-Packard Journal, 1974, p. 1-24.

(Continued)

*Primary Examiner* — Jermele M Hollington
(74) *Attorney, Agent, or Firm* — Office of Chief Counsel for National Institute of Standards and Technology

(57) ABSTRACT

A double-balance electronic test apparatus can measure inductance, capacitance, and resistance more accurately than a single-balance meter. The double-balance electronic test apparatus includes two circuits to balance the impedance of a device under test, and uses the balance to calculate the inductance, capacitance, and resistance of the impedance device under test.

17 Claims, 29 Drawing Sheets

(56) References Cited

OTHER PUBLICATIONS

Wang, Y., et al., "Evaluations of a Sampling Impedance Bridge", 2020 Conference on Precision Electromagnetic Measurements (IEEE), 2020, pp. 1-2, Accessed online: Feb. 24, 2023, DOI: https://doi.org/10.1109/CPEM49742.2020.9191849.
Feige, M., et al., "Evaluations of a Detector-Limited Digital Impedance Bridge", Journal of Research of the National Bureau of Standards, 2021, p. 126006, vol. 126, Accessed online: Feb. 24, 2023, DOI: https://doi.org/10.6028/res.126.006.
Feige, M., et al., "Comparison of a 100 pF Capacitor with a 12906 $\Omega$ Resistor Using a Digital Impedance Bridge.", IEEE Transactions on Instrumentation and Measurement, 2022, p. 1500407, vol. 71.
Overney, F., et al., "Impedance bridges: from Wheatstone to Josephson", Metrologia, 2018, p. S119-S134, vol. 55.
Kucera, J., et al., "Automated capacitance bridge for calibration of capacitors with nominal value from 10 nF up to 10 mF", IEEE, 2012, p. 596-597.
Rybski, R., et al., "Impedance comparison using unbalanced bridge with digital sine wave voltage sources", IEEE Transactions Instrumentation Measurement, 2015, p. 3380-3386, vol. 64 No. 12.
Hlenfeld, W.K., et al., "A digital four terminal-pair impedance bridge", Conf. on Precision Electromagnetic Measurements (IEEE), 2016, p. 1-2.
Souders, T., et al., "Step and frequency response testing of waveform recorders", Proc. IEEE Instrum. Meas. Technol. Conf. (IMTC), 1990, p. 214-220.
Cutkosky, R.D., "Techniques for comparing four-terminal-pair admittance standards", Journal of Research National Bureau of Standards, 1970, p. 63-78, vol. 74C Nos. 3 and 4.
Kucera, J., et al., "Characterization of a precision modular sinewave generator", Measurement Science and Technology, 2020, p. 064002, vol. 31.
Wang, Y., et al., "Evaluation of a sampling impedance bridge", Conference on Precision Electromagnetic Measurements (IEEE), 2020, p. 1-2.
Waltrip, B.C., et al., "AC Power Standard Using a Programmable Josephson Voltage Standard", IEEE Transactions on Instrumentation and Measurement, 2009, p. 1041-1048, vol. 58 No.4.
Jeffery, A., et al., "Conversion of a 2-terminal-pair bridge to a 4-terminal-pair bridge for increased range and precision in impedance measurements", Proc. of 20th Biennial Conf. on Precision Electromagnetic Measurements (IEEE), 1996, p. 358-359.
Callegaro, L., et al., "Experiences with a two-terminal pair digital impedance bridge", IEEE Transactions on Instrumentation and Measurement, 2015, p. 1460-1465, vol. 64 No.6.
Christensen, A.E., et al., "A versatile electrical impedance calibration laboratory based on a digital impedance bridge", 19th International Congress of Metrology (CIM2019), 2019, p. 11002.
Overney, F., et al., "RLC Bridge Based on an Automated Synchronous Sampling System", IEEE Transactions on Instrumentation and Measurement, 2011, p. 2393-2398, vol. 60 No.7.
Ramm, G., et al., "New Multifrequency Method for the Determination of the Dissipation Factor of Capacitors and of the Time Constant of Resistors", IEEE Transactions on Instrumentation and Measurement, 2005, p. 521-524, vol. 54 No. 2.
Small, G.W., et al., "A bridge for the comparison of resistance with capacitance at frequencies from 200 Hz to 2 kHz", Metrologia, 2001, p. 363-368, vol. 38.
Delahaye, F., et al., "Evaluation of the Frequency Dependence of the Resistance and Capacitance Standards in the BIPM Quadrature Bridge", 2004 Conference on Precision Electromagnetic Measurements (IEEE), 2004, p. 372-373.
Thompson, A.M., "An absolute determination of resistance based on a calculable standard of capacitance", Metrologia, 1968, p. 1-7, vol. 4 No. 1.
Shurr, J., et al., "Realizing the farad from two ac quantum Hall resistances", Metrologia, 2009, p. 619-628, vol. 46.
Overney, F., et al., "Josephson-based full digital bridge for high-accuracy impedance comparisons", Metrologia, 2016, p. 1045-1053.
Bauer, S., et al., "A four-terminal-pair Josephson impedance bridge combined with a graphene-quantized Hall resistance", Measurement Science and Technology, 2021, p. 065007, vol. 32.
Marzano, M., et al., "A fully digital bridge towards the realization of the farad from the quantum Hall effect", Metrologia, 2021, p. 015002, vol. 58.
Homan, D.N., "Applications of coaxial chokes to A-C bridge circuits", Journal of Research of the National Bureau of Standards, 1968, p. 161-165, vol. 72C No. 2.
IEEE Standard for Digitizing Waveform Recorders, IEEE Standard 1057-2017, 2018, p. 1-180.
Gournay, P., et al., "Comparison CCEM-K4.2017 of 10 pF and 100 pF capacitance standards", Metrologia, 2019, p. 01001-01001, vol. 56.
Wang, Y., et al., "Improved capacitance measurements with respect to a 1 pF cross-capacitor from 200 to 2000 Hz", IEEE Transactions on Instrumentation and Measurement, 2005, p. 542-545, vol. 54.

* cited by examiner

DOUBLE-BALANCE ELECTRONIC TEST APPARATUS AND MEASURING INDUCTANCE, CAPACITANCE, AND RESISTANCE

CROSS REFERENCE TO RELATED APPLICATIONS

This application claims the benefit of U.S. Provisional Patent Application Ser. No. 63/327,137 (filed Apr. 4, 2022), which is herein incorporated by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in this invention.

BRIEF DESCRIPTION

Disclosed is a double-balance electronic test apparatus for measuring inductance, capacitance, and resistance, the double-balance electronic test apparatus comprising: a testing circuit that comprises: a testing ac waveform generator that produces a test waveform comprising a test phase P1 and a test amplitude A1; a testing ac waveform detector in electrical communication with the testing ac waveform generator and biased at test voltage V1 in operation; and the testing circuit receives an impedance device under test comprising a test impedance Z1, such that the impedance device under test is in electrical communication with the testing ac waveform generator, the testing ac waveform detector, and a virtual ground, and the impedance device under test receives the test waveform from the testing ac waveform generator, wherein the testing circuit produces a test current I1 that flows through the impedance device under test in response to the test impedance Z1 of the impedance device under test subjected to the test waveform; an auto balance circuit in electrical communication with the testing circuit and that comprises: a current amplifier in electrical communication with the virtual ground and that produces an auto balance current I2 based on a voltage of the virtual ground and produces an auto balance waveform comprising an auto balance phase P2 and an auto balance amplitude A2; an auto balance ac waveform detector in electrical communication with the current amplifier and biased at auto balance voltage V2 in operation; and an auto balance reference ac resistor comprising an auto balance impedance Z2 in electrical communication with the auto balance ac waveform detector, the current amplifier, and the virtual ground, such that the auto balance reference ac resistor receives the auto balance waveform from the current amplifier, wherein the auto balance circuit produces an auto balance current I2 that flows through the auto balance reference ac resistor in response to the auto balance impedance Z2 of the auto balance reference ac resistor subjected to the auto balance waveform; and a coarse balance circuit in electrical communication with the testing circuit, the auto balance circuit, and the virtual ground and that comprises: a coarse balance ac waveform generator that produces a coarse balance waveform comprising a coarse balance phase P3 and a coarse balance amplitude A3; a coarse balance ac waveform detector in electrical communication with the coarse balance ac waveform generator and biased at coarse balance voltage V3 in operation; and a coarse balance reference ac resistor comprising a coarse balance impedance Z3 in electrical communication with the coarse balance ac waveform detector, the coarse balance ac waveform generator, and the virtual ground, such that the coarse balance reference ac resistor receives the coarse balance waveform from the coarse balance ac waveform generator, wherein the coarse balance circuit produces a coarse balance current I3 that flows through the coarse balance reference ac resistor in response to the coarse balance impedance Z3 of the coarse balance reference ac resistor subjected to the coarse balance waveform.

Disclosed is a double-balance electronic test apparatus for measuring inductance, capacitance, and resistance, comprising: a coarse balance inductive voltage divider that produces a reference voltage ratio; a coarse balance circuit, digitally controlled through a feedback loop, for maintaining balance in the double-balance electronic test apparatus and comprising the coarse balance inductive voltage divider; a current amplifier for achieving fine balance of the double-balance electronic test apparatus; a synchronizer for synchronously sampling a test voltage V1 across a impedance device under test and a coarse balance voltage V3 across a coarse balance reference ac resistor to measure the residual deviation and phase factor of the impedance ratio of a coarse balance impedance Z3 of the coarse balance reference ac resistor to a test impedance Z1 of the impedance device under test; a correlation analysis and source fluctuation suppression circuit for establishing the reference voltage ratio to calculate the impedance ratio; wherein the modulus of the impedance ratio is matched arbitrarily close to the ratio of the coarse balance inductive voltage divider in magnitude, and the double-balance electronic test apparatus provides accurate measurements of the test impedance Z1 relative to coarse balance impedance Z3 with high precision and stability.

Disclosed is a double-balance electronic test apparatus for measuring inductance, capacitance, and resistance, comprising: a coarse balance circuit, a testing circuit, and an auto balance circuit that measure the inductance, capacitance, and resistance of an impedance device under test, such that the measure of the inductance, capacitance, and resistance is more accurate than measurement with a single-balance LCR meter; the coarse balance circuit and the auto balance circuit are connected in parallel to the impedance device under test arranged in the testing circuit, wherein the auto balance circuit measures an auto balance impedance Z2 of an auto balance reference ac resistor, the coarse balance circuit measures a coarse balance impedance Z3 of a coarse balance reference ac resistor, and the testing circuit measures a test impedance Z1 of the impedance device under test, such that an impedance ratio of the coarse balance impedance Z3 to the test impedance Z1 is determined by the difference between: a ratio of a coarse balance voltage V3 to a test voltage V1; and a product of: a ratio of the coarse balance impedance Z3 to the auto balance impedance Z2; and a ratio of an auto balance voltage V2 to the test voltage V1.

Disclosed is a process for measuring inductance, capacitance, and resistance, the process comprising: providing a double-balance electronic test apparatus; connecting an impedance device under test to the double-balance electronic test apparatus; applying a test waveform to the impedance device under test; measuring a test current I1 that flows through the impedance device under test; using the measurement of the test current I1 to determine the test impedance Z1 of the impedance device under test; comparing the test impedance Z1 of the impedance device under test to a coarse balance impedance Z3 provided by a coarse balance reference ac resistor; using the comparison to calculate the inductance, capacitance, and resistance of the impedance device under test.

BRIEF DESCRIPTION OF THE DRAWINGS

The following description cannot be considered limiting in any way. Various objectives, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
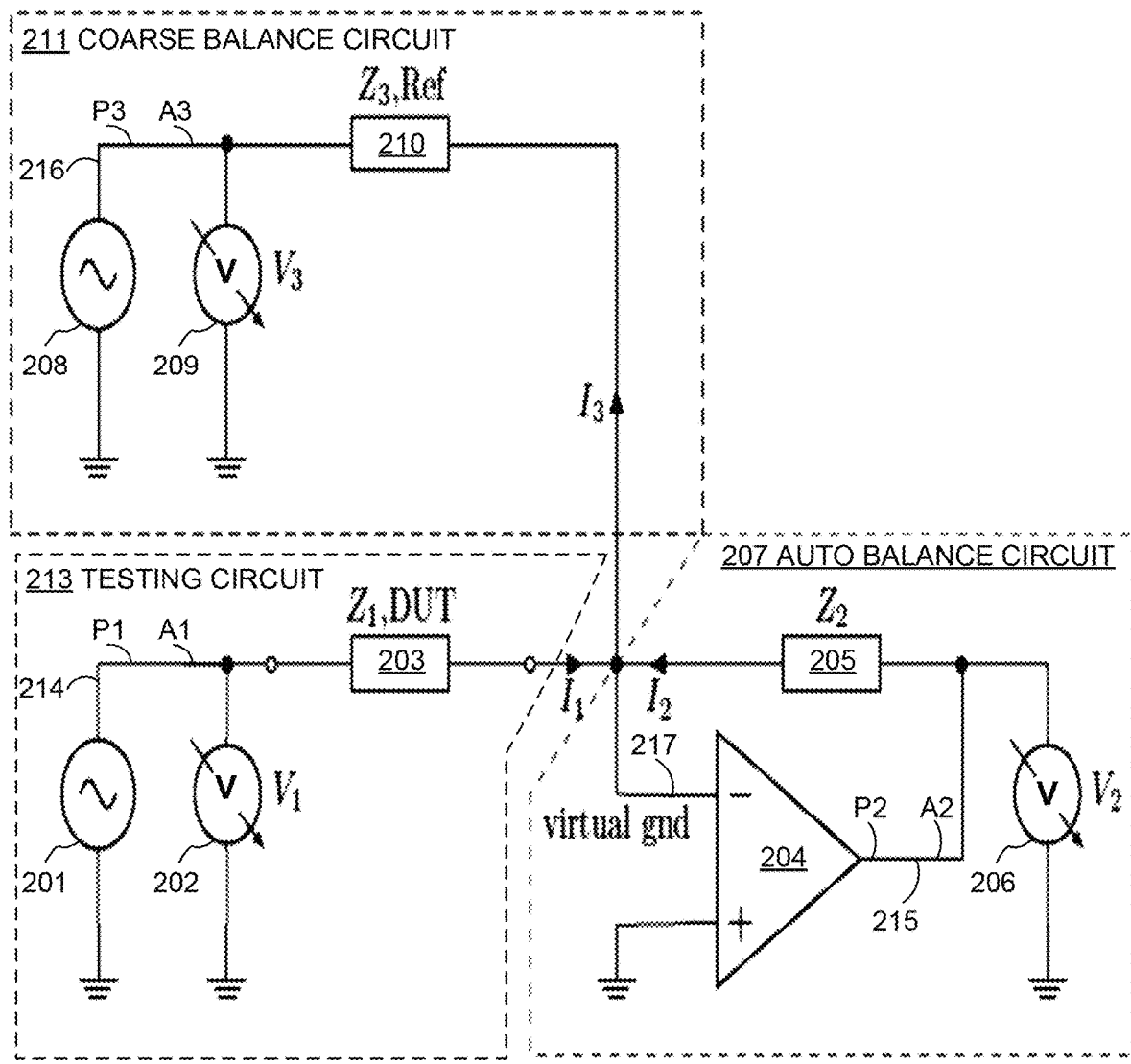
FIG. 1 shows a double-balance electronic test apparatus, according to some embodiments.

A detailed description of one or more embodiments is presented herein by way of exemplification and not limitation.

An LCR meter is an electronic test instrument that measures inductance (L), capacitance (C), and resistance (R) of an electronic component. It can be used to test capacitors, inductors, and resistors. The LCR meter works by applying a voltage to the component under test and measuring the current that flows through it. The ratio of the voltage to the current is the impedance of the component. The LCR meter can then calculate the inductance, capacitance, and resistance of the component based on its impedance. Some conventional LCR meters have a four-terminal Kelvin connection to connect to the component under test. The Kelvin connection minimizes errors due to cabling and connection to the device under test (DUT). Operation of an LCR meter includes connecting test leads to terminals on the meter; selecting the appropriate test frequency and range; and connecting the DUT to the test probes and subjecting the DUT to the voltage. The LCR meter then displays the inductance, capacitance, and resistance of the component.

A voltage source provides the voltage that is applied to the component under test. A current meter measures the current that flows through the component under test. An impedance calculator calculates the impedance of the component under test based on the voltage and current measurements. A display displays the inductance, capacitance, and resistance of the component under test. The test probes are used to connect the LCR meter to the component under test.

LCR meters are used in electronics manufacturing, repair, and education. They can be used to test capacitors, inductors, and resistors. They can also be used to measure the impedance of components. LCR meters are a valuable tool for electronics engineers and technicians, particularly for troubleshooting and repairing electronic circuits. They can also be used to test the quality of electronic components.

Conventional LCR meters are limited in their ability to measure inductance, capacitance, and resistance accurately. This is due to a number of factors, including: use of a single-balance circuit, which can be affected by noise and drift; use of a fixed reference impedance, which can be affected by temperature and other factors; or use of a analog display, which can be inaccurate. These limitations can lead to errors in the measurement of inductance, capacitance, and resistance, collectively referred to as measurement of LCR. These errors can be particularly significant in the measurement of components with large impedance.

Some conventional LCR meters auto-balance the current through the DUT directly with the current through a reference resistor in the feedback loop of a current amplifier. The impedance ratio of the DUT to the reference resistor is directly determined through measurements of the voltage ratio. The gain error of the amplifier is a major error source. Another error source that hinders conventional LCR meters to be used as metrological tools is the nonlinearity of ac waveform detectors since the voltage applied to the DUT can differ from the voltage across the reference resistor.

It has been discovered that double-balance electronic test apparatus 200 improves the accuracy of LCR meters over conventional technology and overcomes the deficiencies of conventional LCR meters, in part, by including double-balance circuitry that includes two balance circuits, which reduce the gain error of the amplifier and the nonlinearity of ac waveform detectors. This improves the accuracy of the measurement by several orders of magnitude. Since double-balance electronic test apparatus 200 includes two bridges to measure the inductance, capacitance, and resistance of impedance device under test 203, double-balance electronic test apparatus 200 provides more accurate measurements than a single-balance LCR meter. Advantageously, the two bridges are connected to the impedance device under test 203 in parallel. One bridge is used to measure the impedance of impedance device under test 203, and the other bridge is used to measure coarse balance impedance Z3 as a reference impedance. The two bridges are compared, and the two impedances are used to calculate the inductance, capacitance, and resistance of impedance device under test 203. Beneficially, the reference impedance is stable and accurate, e.g., as achieved by using a reference resistor that is made from a material with a low temperature coefficient of resistance. Moreover, double-balance electronic test apparatus 200 alleviates gain error by including coarse balance before auto balance by a current amplifier and alleviates nonlinearity arranging coarse balance inductive voltage divider 212 before coarse balance ac waveform detector 209 to maintain detected voltages (test voltage V1, coarse balance voltage V3) approximately equal in magnitude. As a result, double-balance electronic test apparatus 200 provides improved accuracy as compared with conventional LCR meters and is more useful for a wider range of applications. Accordingly, double-balance electronic test apparatus 200 can be used in high-precision applications, such as the measurement of capacitors and inductors for use in filters and oscillators as well metrological calibrations and critical tests.

Figure 2:
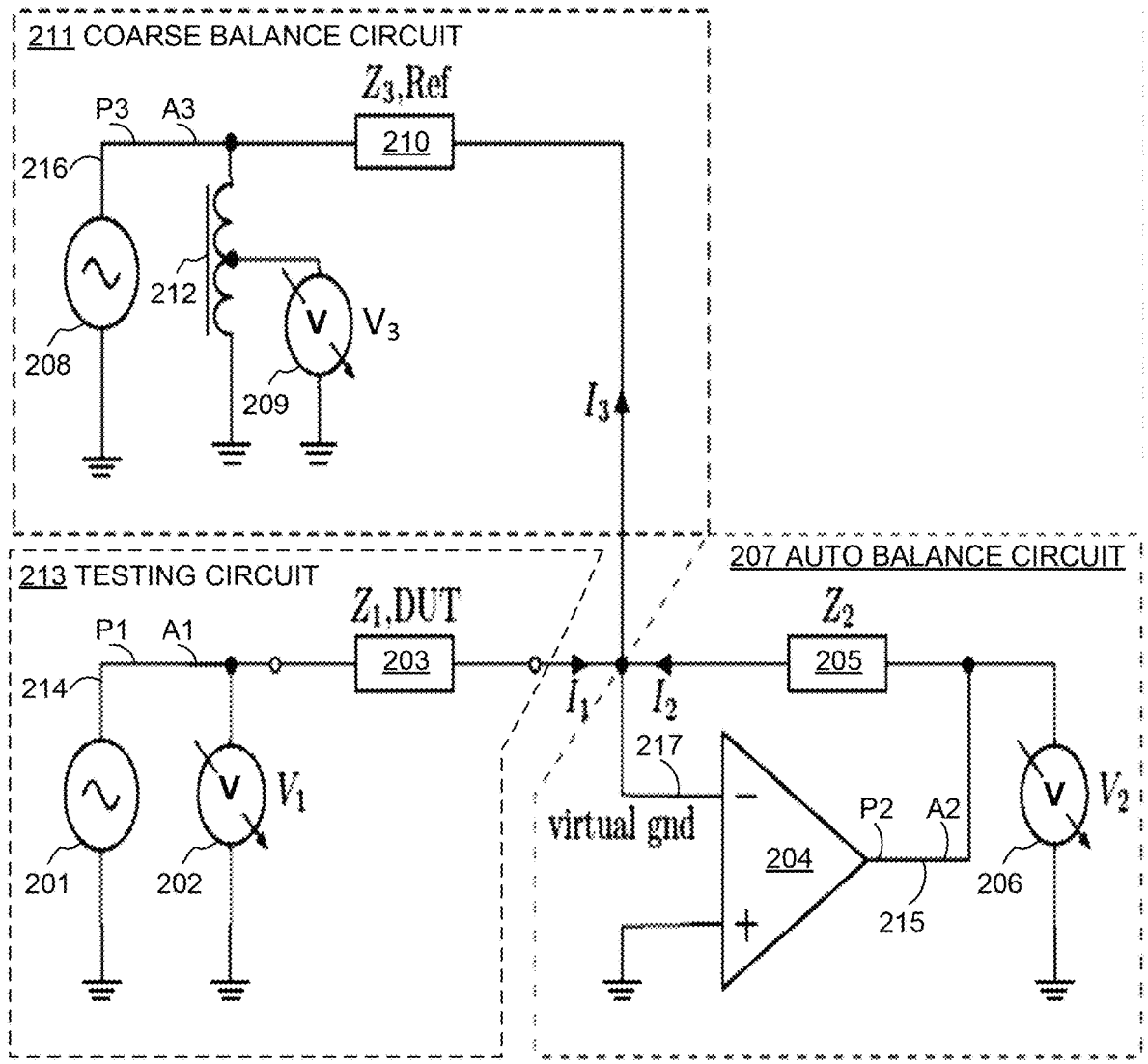
FIG. 2 shows a double-balance electronic test apparatus, according to some embodiments.
Figure 3:
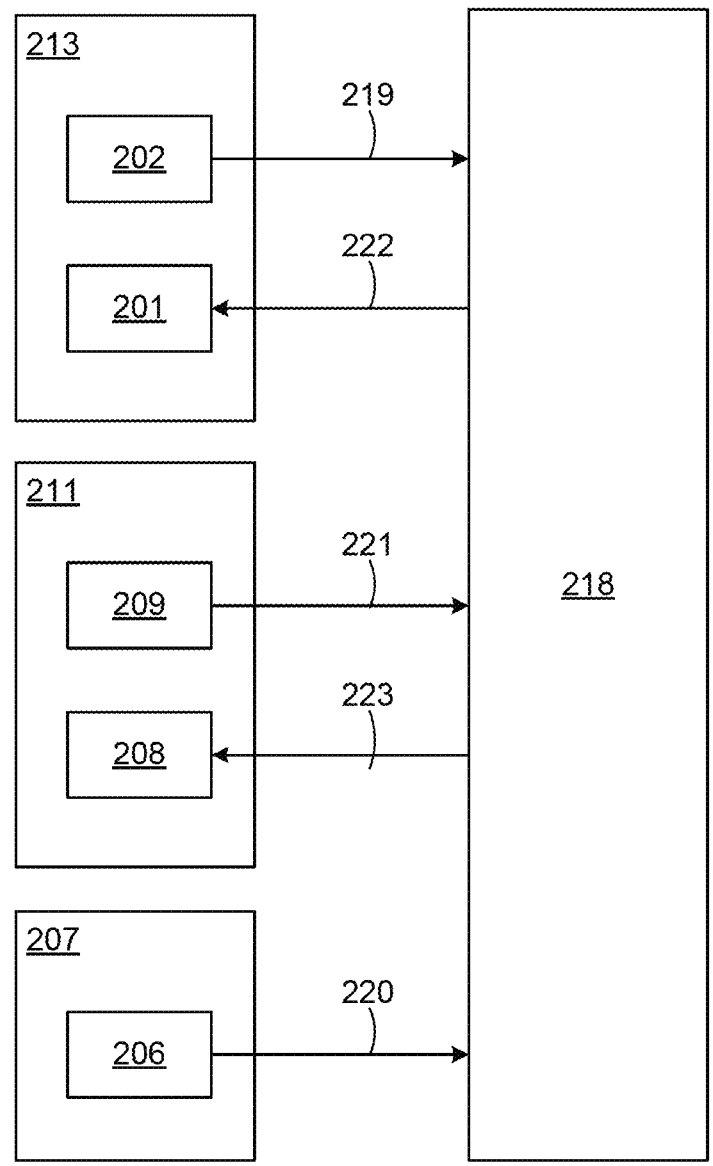
FIG. 3 shows a synchronizer of a double-balance electronic test apparatus, according to some embodiments.

In an embodiment, with reference to FIG. 1, FIG. 2, and FIG. 3, double-balance electronic test apparatus 200 for measuring inductance, capacitance, and resistance includes: testing circuit 213 that includes: testing ac waveform generator 201 that produces test waveform 214 including test phase P1 and test amplitude A1; testing ac waveform detector 202 in electrical communication with testing ac waveform generator 201 and biased test voltage V1 in operation; and testing circuit 213 receives impedance device under test 203 including test impedance Z1, such that impedance device under test 203 is in electrical communication with testing ac waveform generator 201, testing ac waveform detector 202, and virtual ground 217, and impedance device under test 203 receives test waveform 214 from testing ac waveform generator 201, wherein testing circuit 213 produces test current I1 that flows through impedance device under test 203 in response to test impedance Z1 of impedance device under test 203 subjected to test waveform 214; auto balance circuit 207 in electrical communication with testing circuit 213 and that includes: current amplifier 204 in electrical communication with virtual ground 217 and that produces auto balance current I2 based on a voltage of virtual ground 217 and produces auto balance waveform 215 including auto balance phase P2 and auto balance amplitude A2; auto balance ac waveform detector 206 in electrical communication with current amplifier 204 and biased auto balance voltage V2 in operation; and auto balance reference ac resistor 205 including auto balance impedance Z2 in electrical communication with auto balance ac waveform detector 206, current amplifier 204, and virtual ground 217, such that auto balance reference ac resistor 205 receives auto balance waveform 215 from current amplifier 204, wherein auto balance circuit 207 produces auto balance current I2 that flows through auto balance reference ac resistor 205 in response to auto balance impedance Z2 of auto balance reference ac resistor 205 subjected to auto balance waveform 215; and coarse balance circuit 211 in electrical communication with testing circuit 213, auto balance circuit 207, and virtual ground 217 and that includes: coarse balance ac waveform generator 208 that produces coarse balance waveform 216 including coarse balance phase P3 and coarse balance amplitude A3; coarse balance ac waveform detector 209 in electrical communication with coarse balance ac waveform generator 208 and biased at coarse balance voltage V3 in operation; and coarse balance reference ac resistor 210 including coarse balance impedance Z3 in electrical communication with coarse balance ac waveform detector 209, coarse balance ac waveform generator 208, and virtual ground 217, such that coarse balance reference ac resistor 210 receives coarse balance waveform 216 from coarse balance ac waveform generator 208, wherein coarse balance circuit 211 produces coarse balance current I3 that flows through coarse balance reference ac resistor 210 in response to coarse balance impedance Z3 of coarse balance reference ac resistor 210 subjected to coarse balance waveform 216.

In an embodiment, with reference to FIG. 3, double-balance electronic test apparatus 200 includes synchronizer 218 in electrical communication with coarse balance circuit 211 and testing circuit 213. Testing ac waveform detector 202 produces test signal 219 from test voltage V1 across test impedance Z1; coarse balance ac waveform detector 209 produces coarse balance signal 221 from coarse balance voltage V3 across coarse balance impedance Z3; and synchronizer 218 receives test signal 219 from testing ac waveform detector 202 and receives coarse balance signal 221 from coarse balance ac waveform detector 209. Synchronizer 218 produces test synchronization signal 222 from test signal 219; synchronizer 218 produces coarse balance synchronization signal 223 from coarse balance signal 221; and synchronizer 218: adjusts test amplitude A1 and test phase P1 of testing ac waveform generator 201 with test synchronization signal 222, and adjusts coarse balance amplitude A3 and coarse balance phase P3 of coarse balance ac waveform generator 208 with coarse balance synchronization signal 223 to synchronize testing ac waveform generator 201 and coarse balance ac waveform generator 208. In some embodiments, coarse balance current I3 is approximately equal and opposite to test current I1.

In an embodiment, with reference to FIG. 2, coarse balance circuit 211 includes coarse balance inductive voltage divider 212 in electrical communication with coarse balance ac waveform generator 208, coarse balance ac waveform detector 209, and coarse balance reference ac resistor 210, and coarse balance inductive voltage divider 212 is electrically interposed between coarse balance reference ac resistor 210 and coarse balance ac waveform detector 209. In an embodiment, test voltage V1 and coarse balance voltage V3 are approximately equal in magnitude. In an embodiment, test voltage V1 and coarse balance voltage V3 are approximately equal in magnitude in response to adjusting the output-to-input ratio of coarse balance inductive voltage divider 212. In an embodiment, the detection response of coarse balance ac waveform detector 209 is linear as a result of the output-to-input ratio of coarse balance inductive voltage divider 212.

According to an embodiment, with reference to FIG. 1, an error current between test current I1 and coarse balance current I3 is auto-balanced by auto balance current I2 produced by auto balance circuit 207. In an embodiment, virtual ground 217 is maintained at the low terminal of impedance device under test 203. It should be appreciated that, in the configuration of double balancing, coarse balance circuit 211 reduces auto balance current I2 from current amplifier 204 by approximately four orders of magnitude compared to operation of double-balance electronic test apparatus 200 in an absence of coarse balance circuit 211. In an embodiment, test current I1 is balanced by: coarse balance current I3 through coarse balance impedance Z3 and auto balance current I2 through auto balance impedance Z2. In an embodiment, test current I1 is balanced by: coarse balance current I3 through coarse balance impedance Z3 and auto balance current I2 through auto balance impedance Z2, according to $$\frac{Z_3}{Z_1} = -\frac{V_3}{V_1} - \frac{Z_3}{Z_2}\frac{V_2}{V_1}.$$

In an embodiment, with reference to FIG. 1, FIG. 2, and FIG. 3, double-balance electronic test apparatus 200 for measuring inductance, capacitance, and resistance includes: coarse balance inductive voltage divider 212 that produces a reference voltage ratio; coarse balance circuit 211, digitally controlled through a feedback loop, for maintaining balance in double-balance electronic test apparatus 200 and including coarse balance inductive voltage divider 212; current amplifier 204 for achieving fine balance of double-balance electronic test apparatus 200; synchronizer 218 for synchronously sampling test voltage V1 across impedance device under test 203 and coarse balance voltage V3 across coarse balance reference ac resistor 210 to measure residual deviation and phase factor of the impedance ratio of coarse balance impedance Z3 of coarse balance reference ac resistor 210 to test impedance Z1 of impedance device under test 203; a correlation analysis and source fluctuation suppression circuit for establishing the reference voltage ratio to calculate the impedance ratio; wherein the modulus of the impedance ratio is matched arbitrarily close to the ratio of coarse balance inductive voltage divider 212 in magnitude, and double-balance electronic test apparatus 200 provides accurate measurements of test impedance Z1 relative to coarse balance impedance Z3 with high precision and stability.

In an embodiment, with reference to FIG. 1 and FIG. 2, double-balance electronic test apparatus 200 for measuring inductance, capacitance, and resistance includes: coarse balance circuit 211, testing circuit 213, and auto balance circuit 207 that measure the inductance, capacitance, and resistance of impedance device under test 203, such that the measure of the inductance, capacitance, and resistance is more accurate than measurement with a single-balance LCR meter; coarse balance circuit 211 and auto balance circuit 207 are connected in parallel to impedance device under test 203 arranged in testing circuit 213, wherein auto balance circuit 207 measures auto balance impedance Z2 of auto balance reference ac resistor 205, coarse balance circuit 211 measures coarse balance impedance Z3 of coarse balance reference ac resistor 210, and testing circuit 213 measures test impedance Z1 of impedance device under test 203, such that an impedance ratio of coarse balance impedance Z3 to test impedance Z1 is determined by the difference between: a ratio of coarse balance voltage V3 to test voltage V1; and a product of: a ratio of coarse balance impedance Z3 to auto balance impedance Z2; and a ratio of auto balance voltage V2 to test voltage V1.

In an embodiment, a double-balance electronic test apparatus 200 for comparison of two unlike impedances includes coarse balance of double-balance electronic test apparatus 200 maintained through digital feedback and fine balance achieved by a current amplifier. The modulus of the impedance ratio is matched arbitrarily close to the ratio of an inductive voltage divider in magnitude, and the residual deviation between the two together with the phase factor of the impedance ratio is measured through synchronously sampling the voltages. The reference voltage ratio to calculate the impedance ratio is established after correlation analysis and suppression of source fluctuations.

In an embodiment, double-balance electronic test apparatus 200 includes coarse balance circuit 211 in combination with auto balance circuit 207. Test current I1 that flows through impedance device under test 203 and coarse balance current I3 that flows through coarse balance impedance Z3 (a first reference resistor) are approximately equal and opposite by adjusting the amplitude and the phase of two phase-synchronized ac waveform generators (testing ac waveform generator 201 and coarse balance ac waveform generator 208) through computer control. The error current between the two is then auto-balanced by auto balance current I2 that flows through auto balance reference ac resistor 205 that is produced by current amplifier 204. Virtual ground 217 is maintained at the low terminal of impedance device under test 203. The voltages across impedance device under test 203, auto balance reference ac resistor 205, and coarse balance reference ac resistor 210, respectively test voltage V1, auto balance voltage V2, and coarse balance voltage V3, are measured respectively by synchronized ac waveform detectors (testing ac waveform detector 202, auto balance ac waveform detector 206, and coarse balance ac waveform detector 209).

In an embodiment, coarse balance circuit 211 reduces the current through current amplifier 204 by approximately four orders of magnitude and reduces the error associated with current amplifier 204. In some conventional technologies, current through a DUT is directly balanced in a single current loop by current through a reference ac resistor in a feedback loop of a current amplifier. For this configuration, a conventional balance equation is:

$$\frac{Z_2}{Z_1} = -\frac{V_2}{V_1}$$

and the accuracy of conventional impedance ratio measurements is limited by the gain error of such current amplifier.

In double-balance electronic test apparatus 200, test current I1 through impedance device under test 203 is balanced jointly through two current loops: coarse balance circuit 211 (with coarse balance current I3 through coarse balance reference ac resistor 210) and auto balance circuit 207 (with auto balance current I2 through auto balance reference ac resistor 205). The balance equation for double-balance electronic test apparatus 200 is:

$$\frac{Z_3}{Z_1} = -\frac{V_3}{V_1} - \frac{Z_3}{Z_2}\frac{V_2}{V_1}.$$

Accordingly, the accuracy of the impedance ratio measurements depends on measurements of two ac voltage ratios: V3/V1, and V2/V1. The gain error of current amplifier 204 is reduced because auto balance current I2 through auto balance reference ac resistor 205 is reduced by four orders of magnitude, compared to conventional technology.

In an embodiment, with reference to FIG. 2, the output-to-input ratio of coarse balance inductive voltage divider 212 is adjusted so that double-balance electronic test apparatus 200 is operated with detected voltages (test voltage V1 and coarse balance voltage V3) approximately equal in magnitude to overcomes the nonlinearity of ac waveform detectors (testing ac waveform detector 202 and coarse balance ac waveform detector 209).

In an embodiment, double-balance electronic test apparatus 200 is configured to periodically interchange ac waveform detectors (testing ac waveform detector 202 and coarse balance ac waveform detector 209) to minimize their gain drift.

Double-balance electronic test apparatus 200 can be made of various elements that can be selected based on a frequency response of impedance device under test 203, which can be varied, e.g., by a choice of materials included in coarse balance reference ac resistor 210, current amplifier 204, or auto balance reference ac resistor 205. Elements of double-balance electronic test apparatus 200 can be made of a material that is physically or chemically resilient in an environment in which double-balance electronic test apparatus 200 is disposed. Exemplary materials include a metal, ceramic, thermoplastic, glass, semiconductor, and the like. The elements of double-balance electronic test apparatus 200 can be made of the same or different material and can be monolithic in a single physical body or can be separate members that are physically joined.

Double-balance electronic test apparatus 200 can be made in various ways. It should be appreciated that double-balance electronic test apparatus 200 includes a number of components, wherein such components can be interconnected and placed in communication (e.g., optical communication, electrical communication, mechanical communication, and the like) by physical, chemical, optical, or free-space interconnects. The components can be disposed on mounts that can be disposed on a bulkhead for alignment or physical compartmentalization. As a result, double-balance electronic test apparatus 200 can be disposed in a terrestrial environment or space environment.

Double-balance electronic test apparatus 200 has numerous advantageous and unexpected benefits and uses. In an embodiment, a process for measuring inductance, capacitance, and resistance with double-balance electronic test apparatus 200 includes: providing double-balance electronic test apparatus 200; connecting impedance device under test 203 to double-balance electronic test apparatus 200; applying test waveform 214 to impedance device under test 203; measuring test current I1 that flows through impedance device under test 203; using the measurement of test current I1 to determine test impedance Z1 of impedance device under test 203; comparing test impedance Z1 of impedance device under test 203 to coarse balance impedance Z3 provided by coarse balance reference ac resistor 210; and using the comparison to calculate the inductance, capacitance, and resistance of the impedance device under test 203.

In an embodiment, double-balance electronic test apparatus 200 measures test impedance Z1 of impedance device under test 203 and compares test impedance Z1 to coarse balance impedance Z3. Advantageously, double-balance electronic test apparatus 200 uses the comparison to determine inductance, capacitance, and resistance of impedance device under test 203. Here, inductance, capacitance, and resistance of impedance device under test 203 are calculated by data from testing circuit 213. It should be appreciated that inductance is a measure of how much impedance device under test 203 stores energy. The capacitance is a measure of how much impedance device under test 203 can store charge. The resistance is a measure of how much impedance device under test 203 dissipates energy.

In an embodiment, a controller (e.g., a computer) controls double-balance electronic test apparatus 200 by using a software program that implements the steps of the process described in any of the previous or following description. The software program is responsible for generating the test waveform, detecting the test current, and comparing the impedance of the impedance device under test to a reference impedance. The software program also can be responsible for calculating the inductance, capacitance, and resistance of the impedance device under test.

The controller can communicate with double-balance electronic test apparatus 200 or be part of double-balance electronic test apparatus 200 a serial port or USB port or general purpose bus. The controller can send the test waveform to double-balance electronic test apparatus 200 and can receive the test current from double-balance electronic test apparatus 200. The controller can also send the reference impedance to double-balance electronic test apparatus 200. The controller can then calculate the inductance, capacitance, and resistance of impedance device under test 203 based, e.g., on the test current, the reference impedance, and the test waveform. The controller can then display the inductance, capacitance, and resistance of impedance device under test 203 on a screen. The controller can allow a user to control double-balance electronic test apparatus 200 through a graphical user interface. As a result, the user can select the test waveform, the reference impedance, and the test frequency. The user can view the test current, the inductance, capacitance, and resistance of impedance device under test 203.

In accordance with the description herein, double-balance electronic test apparatus 200 and measuring inductance, capacitance, and resistance include the properties, functionality, hardware, and process steps described herein and embodied in any of the following non-exhaustive list:

- a process (e.g., a computer-implemented method including various steps; or a method carried out by a computer including various steps);
- an apparatus, device, or system (e.g., a data processing apparatus, device, or system including means for carrying out such various steps of the process; a data processing apparatus, device, or system including means for carrying out various steps; a data processing apparatus, device, or system including a processor adapted to or configured to perform such various steps of the process);
- a computer program product (e.g., a computer program product including instructions which, when the program is executed by a computer, cause the computer to carry out such various steps of the process; a computer program product including instructions which, when the program is executed by a computer, cause the computer to carry out various steps);
- computer-readable storage medium or data carrier (e.g., a computer-readable storage medium including instructions which, when executed by a computer, cause the computer to carry out such various steps of the process; a computer-readable storage medium including instructions which, when executed by a computer, cause the computer to carry out various steps; a computer-readable data carrier having stored thereon the computer program product; a data carrier signal carrying the computer program product);
- a computer program product including comprising instructions which, when the program is executed by a first computer, cause the first computer to encode data by performing certain steps and to transmit the encoded data to a second computer; or
- a computer program product including instructions which, when the program is executed by a second computer, cause the second computer to receive encoded data from a first computer and decode the received data by performing certain steps.

Double-balance electronic test apparatus 200 and processes disclosed herein have numerous beneficial uses, including use in high-precision applications, such as the measurement of capacitors and inductors for use in filters and oscillators. Advantageously, double-balance electronic test apparatus 200 overcomes limitations and technical deficiencies of conventional devices and conventional processes as herein described. Conventional methods are not as sensitive as measuring inductance, capacitance, and resistance described herein. Accordingly, double-balance electronic test apparatus 200 can provide higher precision and accuracy for high-value applications than conventional devices.

The articles and processes herein are illustrated further by the following Examples, which are non-limiting.

Example 1

Evaluations of a Sampling Impedance Bridge. In this Example, numbering of equations begins from (1).

Custom-modified ac multimeters together with optimized waveform digitizing software provide an uncertainty of less than 1 part in $10^8$ for nominal 1:1 voltage ratios around 1 kHz in sampling for a digital impedance bridge, that derives the capacitance unit from the ac quantized Hall resistance.

Figure 4:
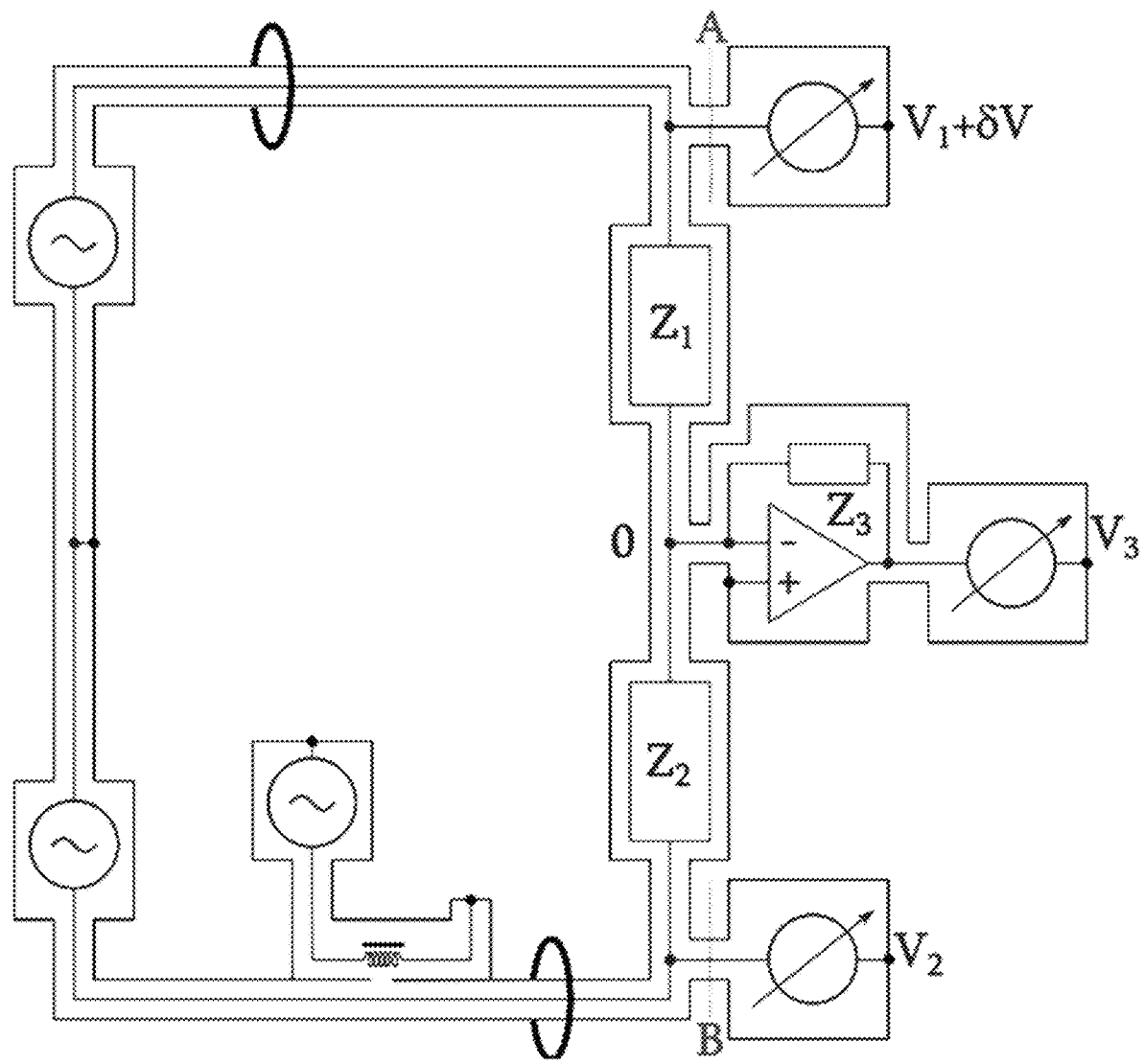
FIG. 4 shows a sampling impedance bridge, wherein ac voltmeters connected to high-potential ports (A and B) are periodically switched to minimize the effect of their gain drift, according to some embodiments.

While transformer-based impedance bridges provide the most accurate measurements for the most demanding applications, including the realization of the capacitance unit from calculable capacitors or from the ac quantized Hall Resistance (acQHR) through a quadrature bridge, the digital bridges have been noticeably improving for impedance comparisons, offering many advantages through computer control and automation. This Example describes a digital approach, using a sampling bridge as shown in FIG. 4, deriving the capacitance unit from the ac quantized Hall resistance.

Bridge Setup

The sampling bridge (FIG. 4) relies on accurate measurements of voltage ratios. In the ideal case, the excitation sources would be adjusted to balance the bridge, achieving the condition of equal current through the two impedances under comparison ($V_3=0$) and the balance equation is $$\frac{Z_1}{Z_2} = -\frac{V_1}{V_2} \qquad (1)$$

where $V_1$ and $V_2$ are the measured voltages at the high potential ports of $Z_1$ and $Z_2$, respectively. Here, two synchronized waveform generators excite the bridge, whose limited resolutions and instabilities cause a slight imbalance of the bridge. The combined effect can be represented by an error voltage, $\delta V$, superimposed on the ideal voltage $V_1$. The error voltage is automatically balanced using a current amplifier with transimpedance of $Z_3$. The common low potential port, O, is kept at virtual ground and the detected error voltage $V_3$ relates to $\delta V$ through:

$$\frac{Z_1}{Z_3} = -\frac{\delta V}{V_3} \qquad (2)$$

The bridge dynamics can be understood as a superposition of the two voltage balancing actions governed by (1) and (2).

Three multimeters, modified to allow their reference oscillators to phase lock with an external 10 MHz reference, measure the voltage ratios. To achieve an overall bridge accuracy of 1 part in $10^8$, the voltage ratio of $V_1+\delta V$ to $V_2$ must be measured better than that. The two main multimeters connected to the high-potential ports (A and B) are periodically interchanged by relays to minimize the effect of their gain drift. $\delta V$ needs only be determined to better than 1 part in $10^4$ through measuring $V_3$ since $\delta V/V_1$ is less than $10^{-4}$ in practice.

The bridge control software calculates multimeter ADC aperture times according to equivalent-time sampling principles to maximize both the effective number of bits and noise rejection. The 1 kHz measurements were performed using a sample rate of 100.2 μsec, thereby acquiring 5000 unique phases of the input waveform over 501 cycles.

Test Results

Figure 5:
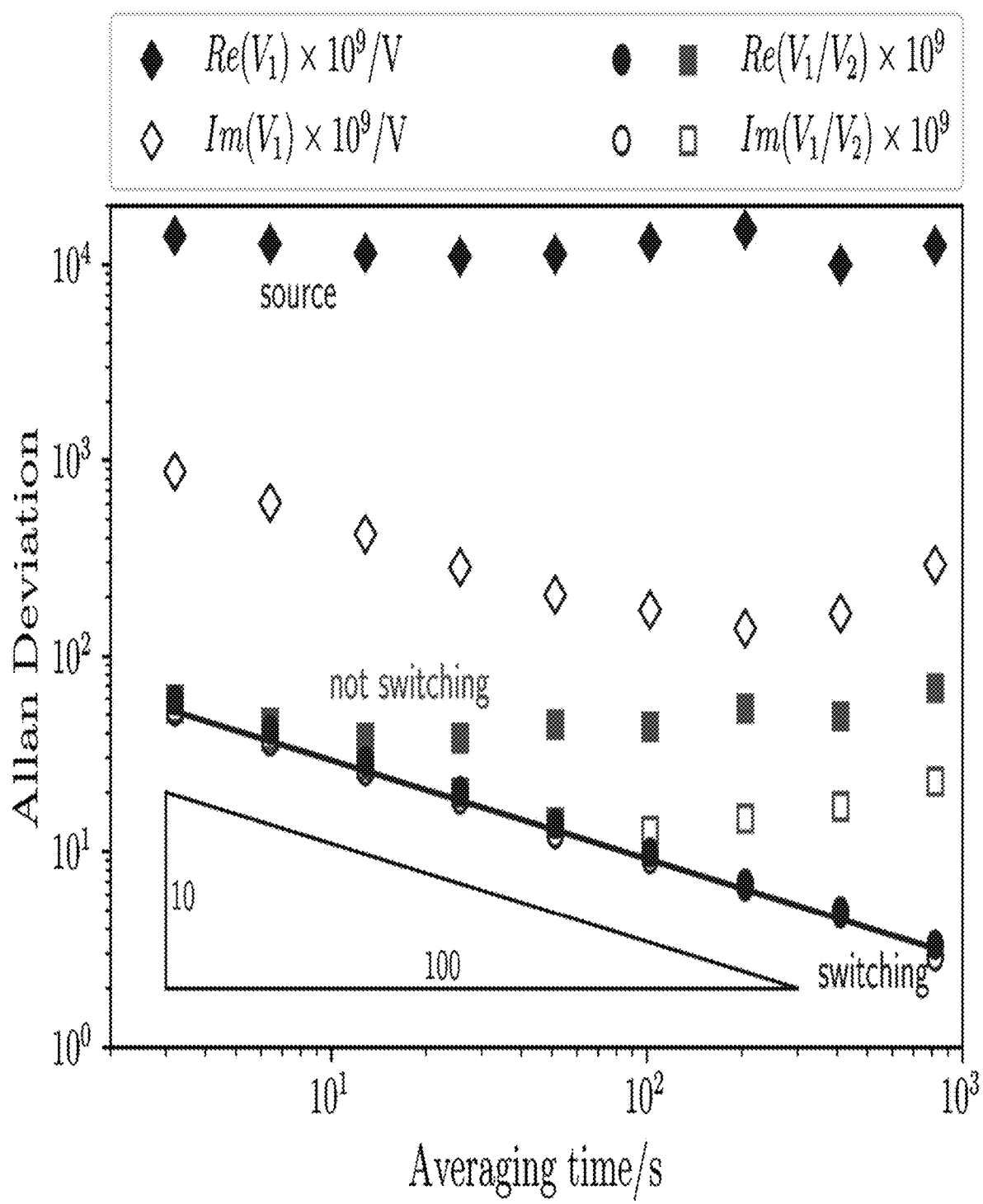
FIG. 5 shows Allan deviations of a single source measured with one multimeter (diamonds) and the ratio of two measurements of the same source with switching off (squares) and switching on (circles), according to some embodiments.

To determine the limitations of the sampling techniques, two multimeters are connected in parallel to the same sinewave output of a generator at 1 kHz and 2 $V_{pk-pk}$. The Allan deviations of the source are shown in FIG. 5. The instability is dominated by 1/f variations in amplitude with the phase variations much smaller (diamonds). The large amplitude variations affect the voltage ratio measurements little since the two multimeters can track the variations within 1 part in $10^7$. The apparent increases of the Allan deviations (squares) after the initial decreases can be attributed to the slow gain drifts of the multimeters. The Allan deviations (circles) of the final test of a unity voltage ratio was acquired with the two multimeters periodically switched, yielding a straight line in the log-log plot. Its slope is consistent with averaging over white noise. Similar results were obtained for the ratio of minus one produced through a three-winding transformer.

Figure 6:
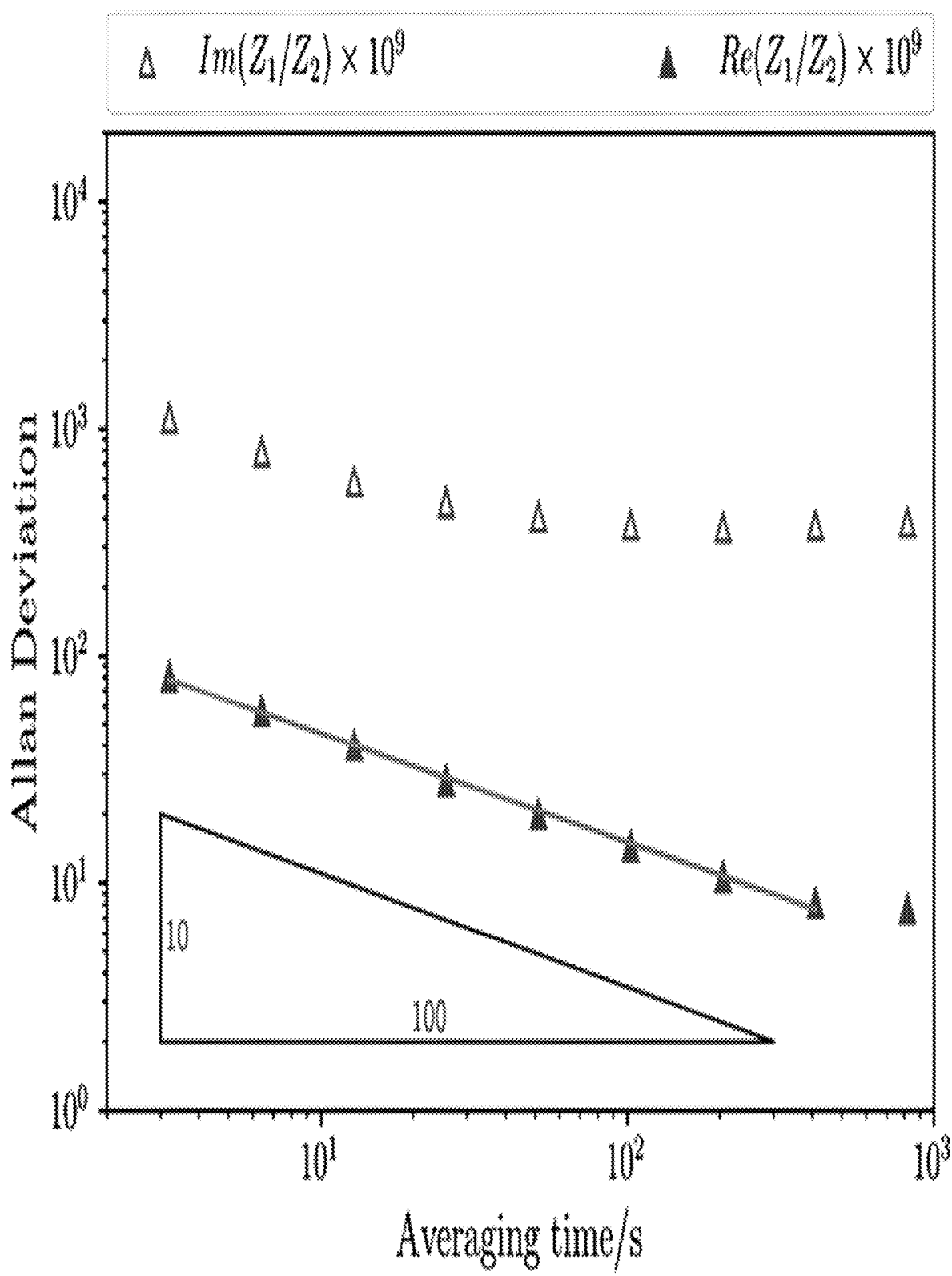
FIG. 6 shows Allan deviations of measured impedance ratio: solid triangle for in-phase component, open triangle for quadrature, according to some embodiments.
Figure 7:
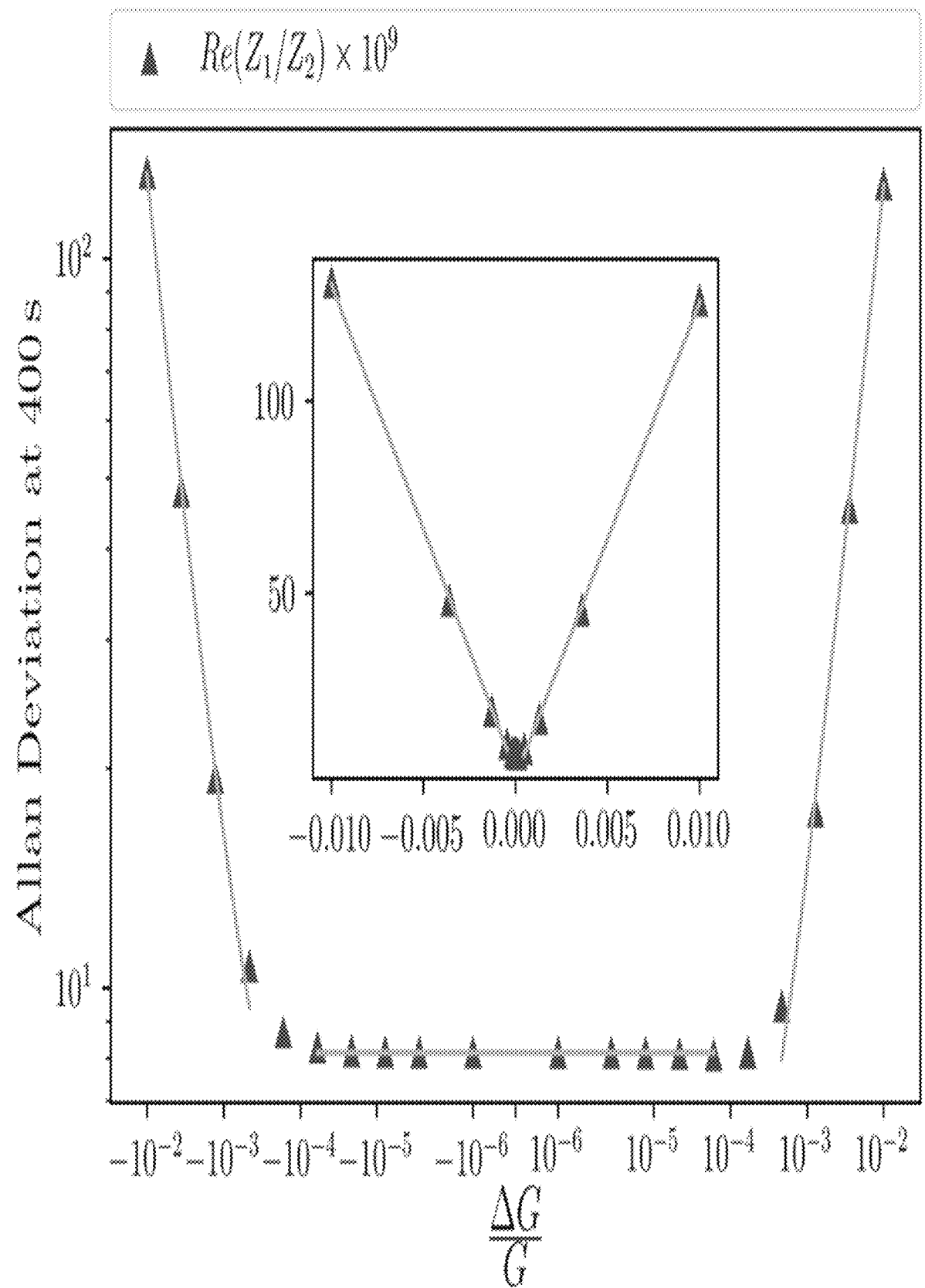
FIG. 7 shows Allan deviation of in-phase resistance ratio as function of $\Delta G/G$, according to some embodiments. The inset shows the same data on linear axes.

The Allan deviations of the measured impedance ratio of two Vishay resistors with a nominal value of 12.906 kΩ are shown in FIG. 6. The data was acquired at 1 kHz and 2 $V_{pk-pk}$, with the resistors' low potential leads soldered together to form a common low potential port to avoid the need of a combining network. The Allan deviations of the in-phase component fall below $10^{-8}$, demonstrating the stability of the sampling bridge. The quadrature component shows larger deviations, indicating less stable capacitive components of the resistors.

Effective cancellation of the source noise using Eq. (2) requires precise determination of the gain, G, between V3 and 6V. The Allan deviation of the in-phase resistance ratio at 400 s is shown as a function of fractional change of G, ΔG/G. The log-log plot shows a broad bottom, indicating that the source noise is largely cancelled out, provided that G is determined within a factor of $10^{-8}$. The Allan deviation increases linearly with the magnitude of large ΔG/G, as shown in the inserted linear plot.

The sampling impedance bridge has a stability and resolution better than one part in $10^8$ at 1 kHz using two nominally equal resistors. Including ac voltage scaling and calibration functions in the bridge maintains the apparent magnitude of the main voltage ratio near when comparing a capacitor with a resistor.

Example 2

Evaluations of a Detector-Limited Digital Impedance Bridge. In this Example, numbering of equations begins from (1).

A digital impedance bridge using two nominally equal resistors to form a 1:1 ratio. Fluctuations of the source voltages are largely removed through post-processing of the digitized data, and the measurement results are limited by the detector noise. This detector-limited operating condition was first demonstrated using three modified Keysight 3458A multimeters for measurements of the voltage ratios, achieving 1 part in $10^8$ Type A uncertainty in less than 15 min at 1 kHz. In an effort to extend the applicable frequency range and develop a system with off-the-shelf components, we have tested a system of using three lock-in detectors for measuring small deviations from the perfect ac ratio of unity magnitude, achieving stabilities and resolutions of a few parts in $10^7$ in a few hours for each point from 1 kHz to 5 kHz.

While transformer-based impedance bridges still provide the measurements with the highest accuracy for the most demanding applications, including the realization of the capacitance unit from calculable capacitors or from the ac quantized Hall Resistance through a quadrature bridge, the digital bridges have been improving for impedance comparisons, offering many advantages through computer control and automation. Josephson arbitrary waveform synthesizers establish a quantum-based voltage ratio standard that can be used for impedance comparisons at any phase angle. Digital signal sources custom-designed for impedance bridges have also shown great promise. A dual channel AC voltage source with amplitude ratio stability of a few parts in $10^9$ and phase resolution of 0.2 μrad at 1 kHz has been reported.

A digital sampling bridge used three multimeters for measurements of the voltage ratios. All three multimeters are modified to allow their reference oscillators to phase lock with an external 10 MHz reference, enabling the control software to calculate multimeter ADC aperture times according to equivalent-time sampling principles to maximize both the effective number of bits and noise rejection. The digital bridge effectively suppresses the source noise by more than two orders of magnitude, and the residual noise is largely white detection noise that can be further reduced through averaging; we have achieved a stability and resolution better than one part in $10^8$ in less than 15 min at 1 kHz for comparisons of two nominally equal resistors. The digital technique employed complements the analog noise suppression techniques.

Figure 8:
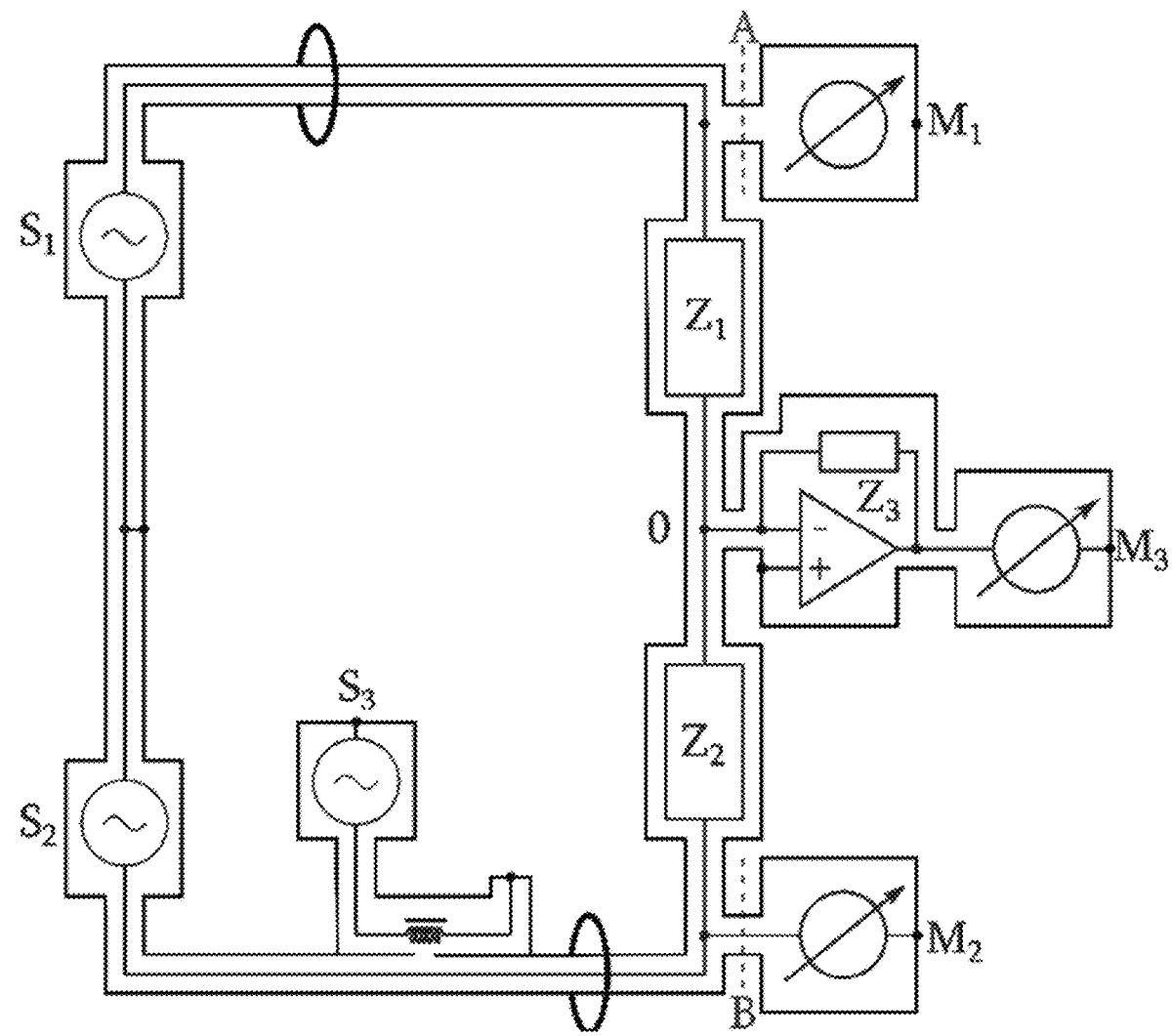
FIG. 8 shows digital impedance bridge, according to some embodiments. Two ac voltmeters connected to the high-potential ports (A and B) are periodically switched to minimize the effect of their gain drift.

A bridge setup is shown in FIG. 8 that provides accurate measurements of voltage ratios. In the ideal case, the excitation sources would be adjusted to balance the bridge, such that for any measured voltage, $V_2$, at the high potential port of $Z_2$, the measured voltage, $V_1$, at the high potential port of $Z_1$, equals to a perfect value $V_{1p}$, achieving the condition of equal current through the two impedances under comparison ($V_3=0$). The balance equation is $$\frac{Z_1}{Z_2} = -\frac{V_{1p}}{V_2} \quad (1)$$

We use two phase-locked channels ($S_1$ and $S_2$) of a waveform generator as the main sources to excite the bridge. To overcome the limited resolutions of the generator outputs, another synchronized generator ($S_3$) is used to inject a fine adjustment signal through a 100:1 injection transformer inserted into the lower excitation arm of the bridge. The residual imbalance voltage combined with the source drifts can be represented by an error voltage, $\delta V$, superimposed on the ideal voltage $V_{1p}$, and we have $V_1=V_{1p}+\delta V$. The error voltage is automatically balanced using a current amplifier with transimpedance of $Z_3$. The common low potential port, 0, is kept at virtual ground and the detected error voltage $V_3$ relates to $\delta V$ through:

$$\frac{Z_1}{Z_3} = -\frac{\delta V}{V_3} \quad (2)$$

The bridge dynamics can be understood as a superposition of the two voltage balancing actions governed by (1) and (2).

Figure 9:
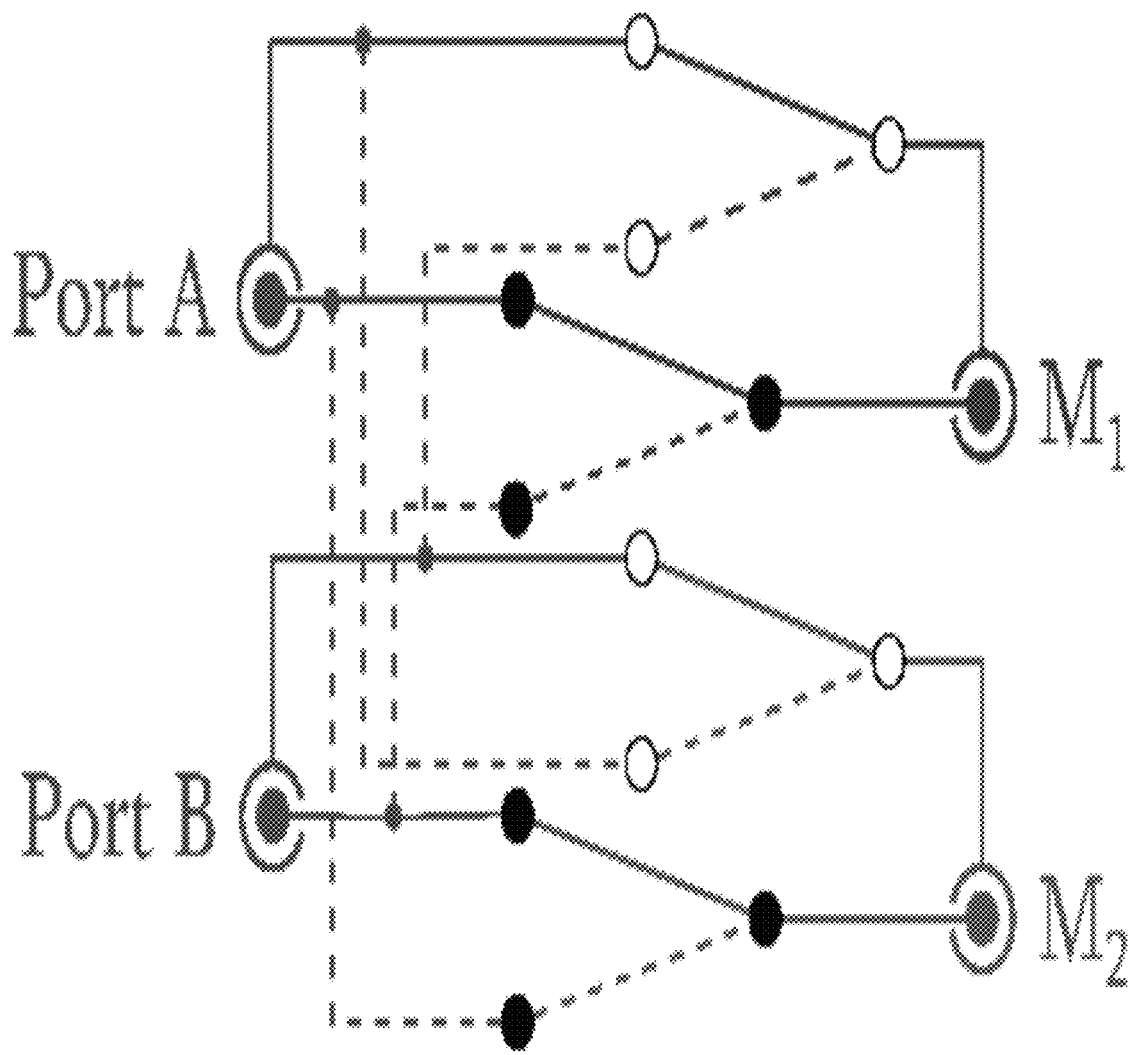
FIG. 9 shows a coaxial switching box, according to some embodiments.

We use three lock-in detectors, $M_1$, $M_2$, and $M_3$, in the float input mode for measurements of $V_1$, $V_2$, and $V_3$, respectively. To achieve an overall bridge accuracy of 1 part in $10^7$, the voltage ratio of $V_1/V_2$ must be measured better than that. The two main lock-in detectors connected to the high-potential ports (A and B) are periodically interchanged every minute as illustrated in FIG. 9, using a custom coaxial switching fixture based-on commercial coaxial relay modules to minimize the effect of their gain drifts. A small loading change at A and B is equivalent to a small change of the excitation voltage ratio which is suppressed in the digital domain by correlation with the bridge error signal. $\delta V$ needs only to be determined to better than 1 part in $10^3$ through measuring $V_3$ since $\delta V/V_1$ is less than $10^4$ in practice.

The bridge layout (FIG. 8) is influenced by a double-loop method to use two-terminal-pair (2TP) bridges for four-terminal-pair (4TP) impedance comparisons, where a 2TP bridge connecting to the high-current ports excites the bridge and another 2 TP loop connecting through the high-potential ports forms a 2TP bridge for the voltage ratio measurements. The two detectors connecting to the ports A and B, together with $Z_1$ and $Z_2$, form a four-arm 2 TP bridge for measuring the voltage ratios, enabling us to achieve the limiting condition where the overall bridge resolution and stability are limited by the detectors rather than the excitation sources as is often the case in a typical 2TP digital bridge. This feature also differentiates this bridge from the digital sampling bridges reported previously. These sampling bridges all have a single 2TP loop and employ a single detector to sample voltages at different potential ports; their performances largely depend on the source stabilities.

We use two resistors (HZ-series) with a nominal value of 12.906 k$\Omega$, closely-matched within a few parts in $10^7$, for $Z_1$ and $Z_2$ in our test setup. The resistors' low leads are soldered together and the soldered point is connected to two BPO connectors. One of the BPO connectors serves as the common low potential port to avoid the need of a combining network, while the other connector provides access to the low current port of each 4TP resistor which is used for dc measurements.

For RC comparisons, the combining network can be absent by comparing 4TP resistors with 2TP capacitors. The current amplifier is connected to the low-potential port of the 4TP resistor. Hence, the cable and the contact resistance between the low-current port of the resistor and the low port of the 2TP capacitor is then considered part of the capacitance standard. As long as the defining planes are applied consistently in calibrations, the inclusion of contact resistance only affects the dissipation factor of the capacitor slightly, with negligible contribution to the uncertainty of the capacitance measurements.

Test Results 3.1 Equal Voltage Test

Figure 10:
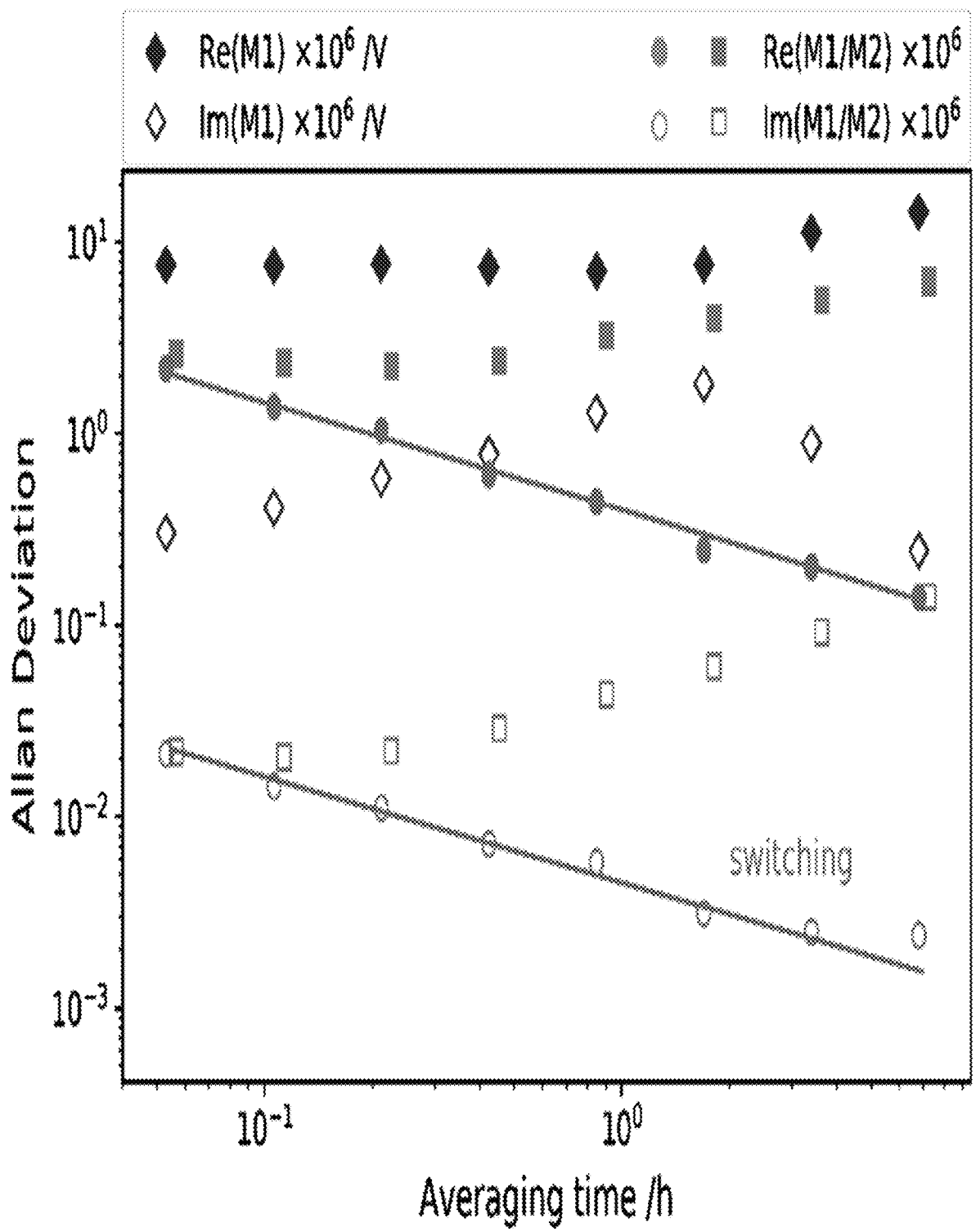
FIG. 10 shows Allan deviations of a single source measured with one lock-in detector (diamonds) and the ratio of two measurements of the same source with switching off (squares) and switching on (circles), according to some embodiments.

Lock-in detectors can be used to measure small ac signals down to the nV range, but they are rarely used to measure large ac signals when low uncertainties are required. This is because the measurement accuracy is limited by the resolution of the ADC and the gain stability of the input amplifier. Typically, the front panel of the SR860 displays only 4 valid digits for the 1 V input range. To determine the limitations of using the lock-in detectors for voltage ratio measurements, we connect two SR860s in parallel to the same sinewave output of a 33500B at 1 kHz and a rms value of 0.7071 V. The timing alignments of the two lock-ins are implemented in the control software using a $M_1$-$M_2$-$M_2$-$M_1$ sequence for the data readings. The Allan deviations of the source are shown in FIG. 10. The source instability is dominated by 1/f variations in amplitude with the phase variations much smaller (diamonds). The voltage ratio measurements show smaller Allan deviations (squares) indicating that the detectors are more stable than the source and the two SR860s can track the variations within a few parts in $10^6$. The apparent increases of the Allan deviations after the initial decreases can be attributed to the slow gain drifts of the lock-in detectors. The Allan deviations (circles) of the final test of a unity voltage ratio was acquired with the two lock-in detectors periodically switched, yielding a straight line in the log-log plot. Its slope is consistent with averaging over white noise.

3.2 Digitized Voltages of Bridge

Figure 11:
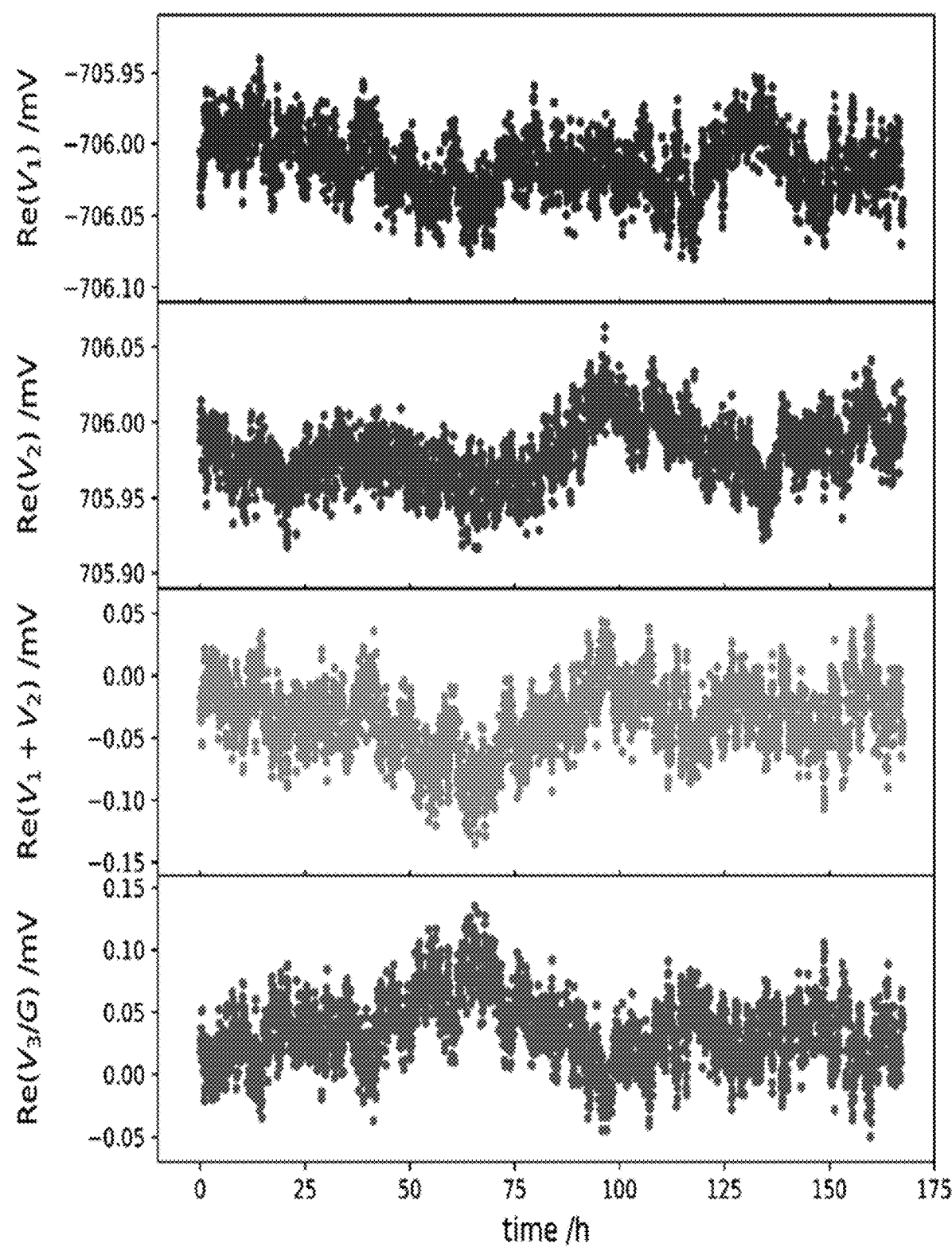
FIG. 11 shows real components of recorded voltages as function of time: (1). V1, (2). V2, (3). V1+V2, (4). V3 scaled with the gain of the transimpedance amplifier, according to some embodiments.
Figure 12:
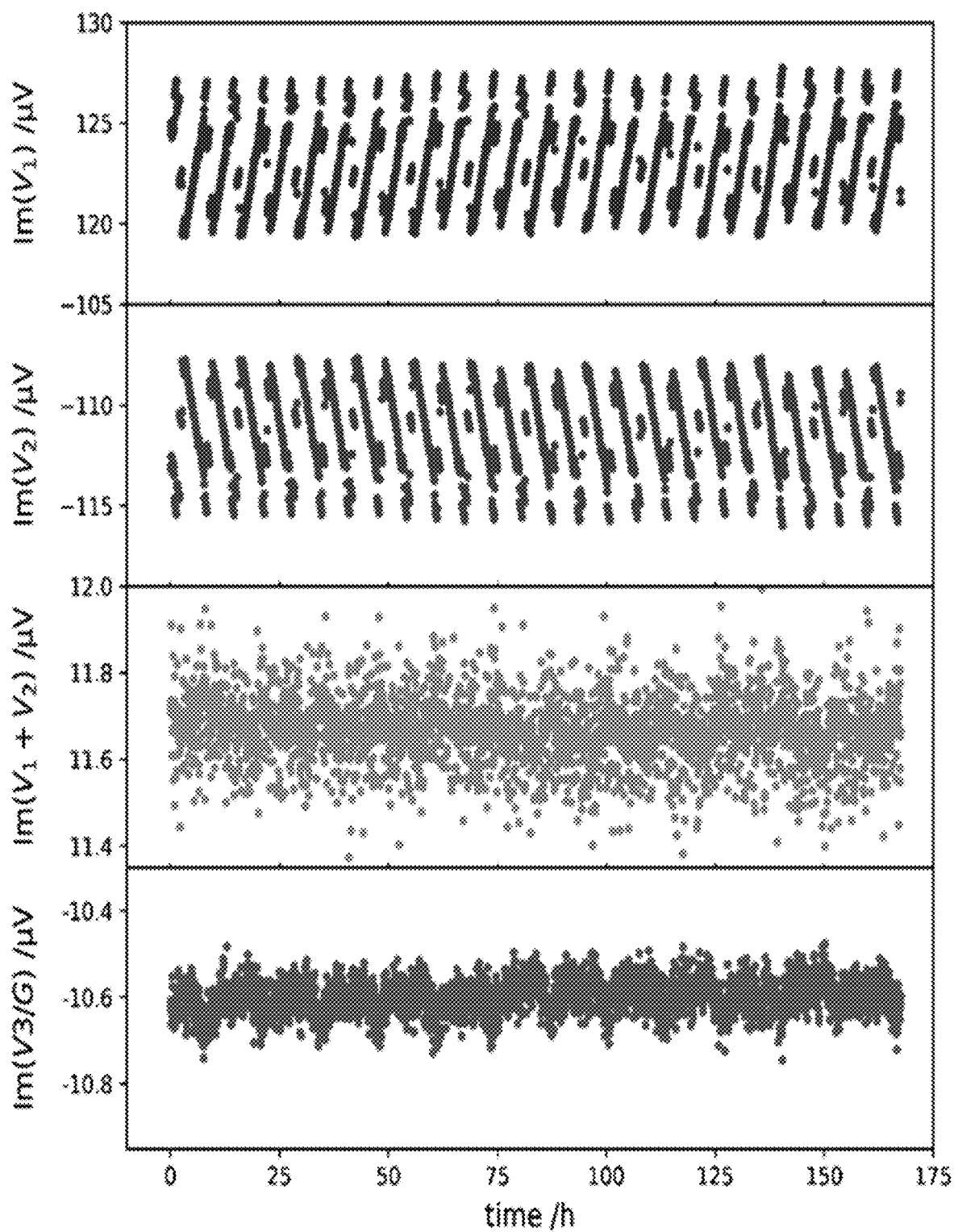
FIG. 12 shows imaginary components of recorded voltages as function of time: (1). V1, (2). V2, (3). V1+V2, (4). V3 scaled with the gain of the transimpedance amplifier, according to some embodiments.

A major advantage of the digital bridge is that the excitation voltages and the error signal can be fully digitized, and the bridge dynamics can be analyzed in post processing. All the test results presented below were acquired with the bridge setup shown in FIG. 8, with the two resistors in an air bath at 23° C. The gain of the transimpedance amplifier is set at $10^7$ V/A and the corresponding $Z_3$ is approximately 10 M$\Omega$; the 3 dB bandwidth at this setting is 50 kHz. The timing alignments of the three lock-ins were implemented in the control software using a $M_1$-$M_2$-$M_3$-$M_2$-$M_1$ sequence for the data readings. Shown in FIG. 11 and FIG. 12 are the measured V1, V2, and V3 as a function of time that were acquired at 1 kHz and a rms value of 0.7071 V. The reference phases of the three lock-in detectors were initially aligned using the excitation source driving $Z_2$, and they are not disturbed in subsequent bridge balancing to minimize $V_3$. The real parts of $V_1$ and $V_2$ (FIG. 11) fluctuate more than the imaginary counterparts (FIG. 12), reflecting that the digital sources have better phase stabilities than the amplitude stabilities. The phases of $V_1$ and $V_2$ show a strong anti-correlation (FIG. 12). A strong amplitude correlation has also been demonstrated by turning off the room temperature control. In normal operation, the laboratory temperature fluctuates within 1° C., and the amplitude correlation of $V_1$ and $V_2$ is not obvious even when they are dominated by two output channels of the same waveform generator (FIG. 11).

The periodic phase fluctuations of $V_1$ and $V_2$ (FIG. 12) are interesting. Im($V_1$) and Im($V_2$) form mirror images of each other, and their periodic patterns disappear when they are summed together. The observed phase correlation remains even when $V_1$ and $V_2$ are driven by separate waveform generators. We speculate that the periodic phase fluctuations result from phase-locking actions inside $M_1$ and $M_2$, originating from the finite word length of a direct digital synthesizer that generates the reference signal.

We can qualitatively understand how the detected error voltage $V_3$ relates to the source fluctuation $\delta V$ by considering that the transimpedance amplifier together with $Z_1$ and $Z_2$ form a summing amplifier. Since $Z_1$ and $Z_2$ are nominally equal, the input voltage to the summing amplifier is $V_1+V_2 \approx \delta V$. As can be seen in FIG. 11, Re($V_1+V_2$) closely match with $-$Re($V_3$) with the latter being scaled with an estimated gain factor. Fluctuations of Im($V_1+V_2$) and Im($V_3$) are smaller than their real counterparts by two orders of magnitude and both are dominated by white noise.

3.3 Noise Cancellation and Results

To analyze the dynamics of the bridge balancing more rigorously, we apply Kirchhoff's law to point 0 of the bridge circuit:

$$\frac{V_1}{Z_1} + \frac{V_2}{Z_2} + \frac{V_3}{Z_3} = 0 \tag{3}$$

Rearranging (3) provides:

$$\frac{V_1}{V_2} + \frac{Z_1}{Z_2} + \frac{Z_1}{Z_3}\frac{V_3}{V_2} = 0 \tag{4}$$

Using conventional notations, the impedance ratio is:

$$\frac{Z_1}{Z_2} = 1 + \alpha + i\beta \tag{5}$$

Further, the gain factors between $Z_1$ and $Z_3$ is:

$$g = |g|e^{i\theta} \equiv \frac{Z_1}{Z_3} \text{ and } G = 1/g \tag{6}$$

Eq. (4) is rewritten as follows:

$$\frac{V_1}{V_2} + 1 = -\alpha - i\beta - g\frac{V_3}{V_2} \tag{7}$$

If the bridge system were noise free and we had unlimited resolutions in $V_1$ and $V_2$, then the voltages could be adjusted to achieve the balance condition ($V_3=0$) and easily determine $\alpha$ and $\beta$. If the bridge system were noise free but we have limited resolutions in $V_1$ and $V_2$, we need to operate the bridge at minimum of two different ratios of $V_1/V_2$ so that the complex gain parameter g with a magnitude |g| and an argument 0 can be determined first. In practice, the gain parameter is determined in two steps by analyzing the correlation between the fluctuating $V_1/V_2$ and $V_3/V_2$. Define u and w to be:

$$u = \frac{V_1}{V_2} + 1 \tag{8}$$

and $$w = -|g|\frac{V_3}{V_2} \tag{9}$$

Figure 13:
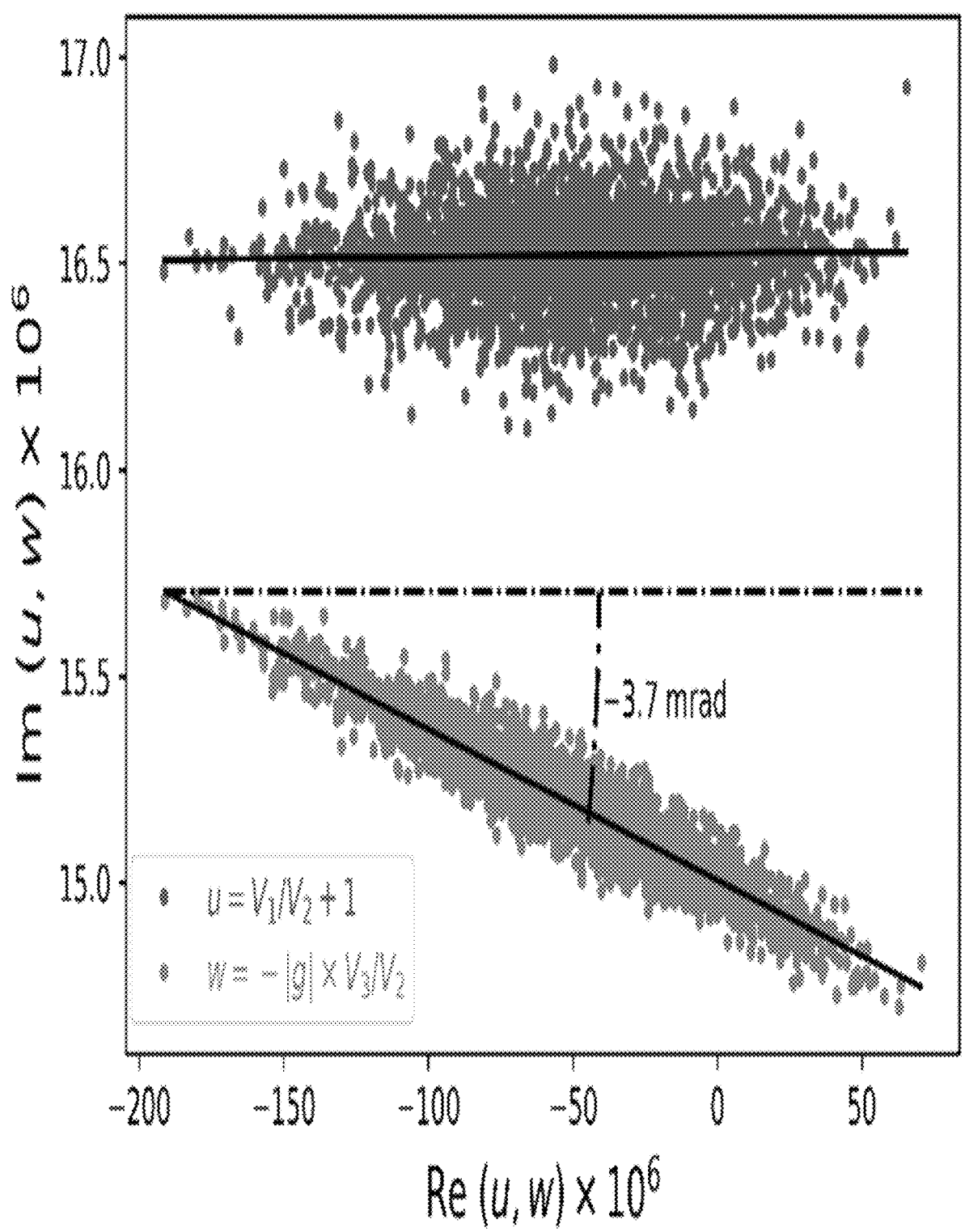
FIG. 13 shows imaginary part vs real part: u in green and w in purple. The obtained angle is independent of |g|, according to some embodiments.
Figure 14:
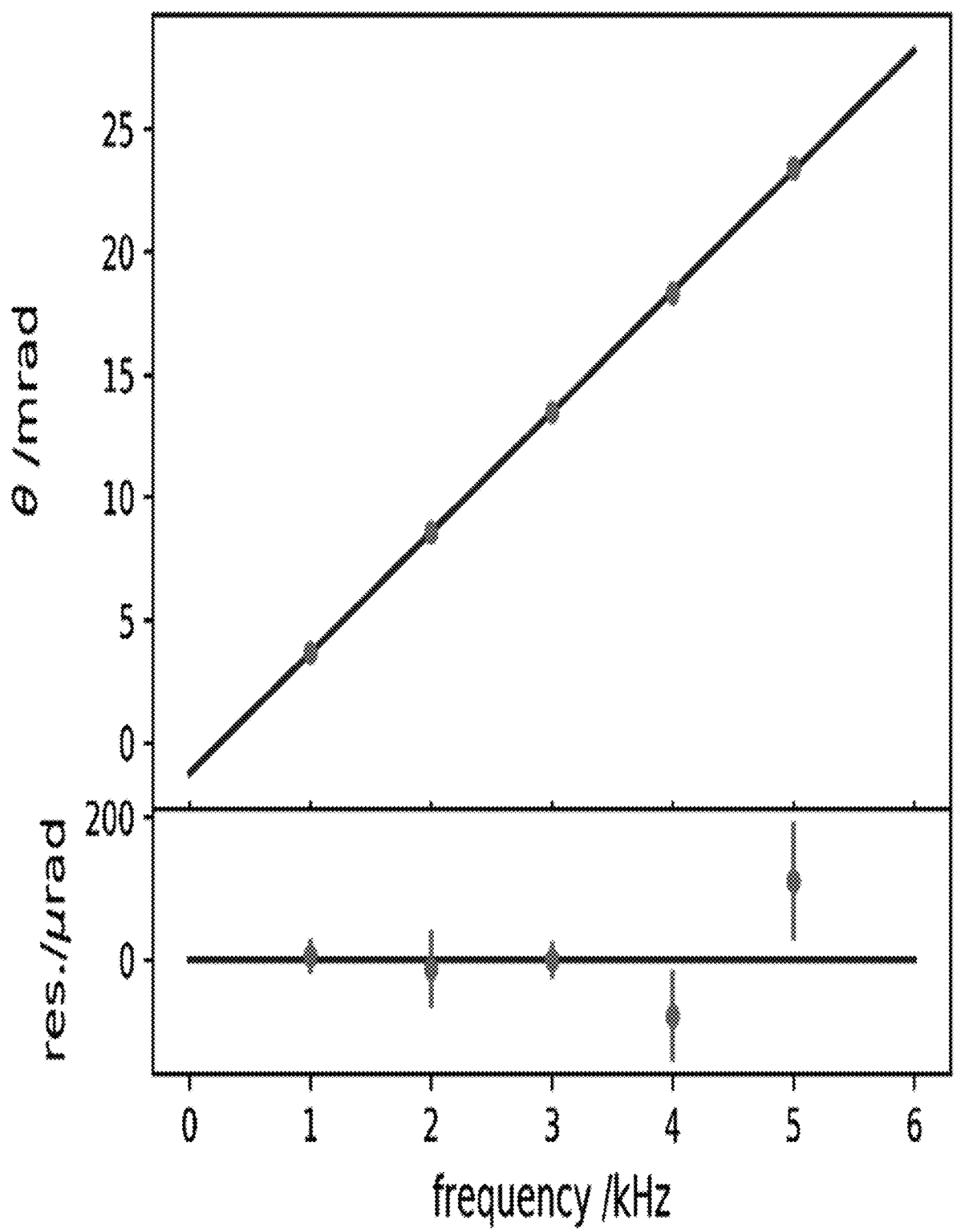
FIG. 14 shows a phase shift of transimpedance amplifier as a function of frequency (top). Residual after fitting with a straight line (bottom), according to some embodiments.

To obtain the argument, plot the imaginary part vs the real part for u and w at 1 kHz as in FIG. 13. The fluctuation of u is mainly along the real axis, and the distribution of w exhibits a similar pattern except in a tilted angle. Line fitting to the two patterns allows us to determine the angle θ. Note the angle remains the same, whether |g| is known or not because the real and imaginary parts of $V_3/V_2$ are scaled by the same factor. In FIG. 13, we use the approximate gain factor to demonstrate that u and w are about the same. FIG. 14 shows the measured θ as a function of frequency from 1 kHz to 5 kHz. The linear frequency dependence can be understood by modeling Z3 as a parallel RC network. With the angle θ determined, it is helpful to further introduce $$v = -e^{i\theta}\frac{V_3}{V_2} \tag{10}$$

From (7), we have $$\text{Re}(u) = -\alpha + |g|\text{Re}(v) \tag{11}$$

Figure 15:
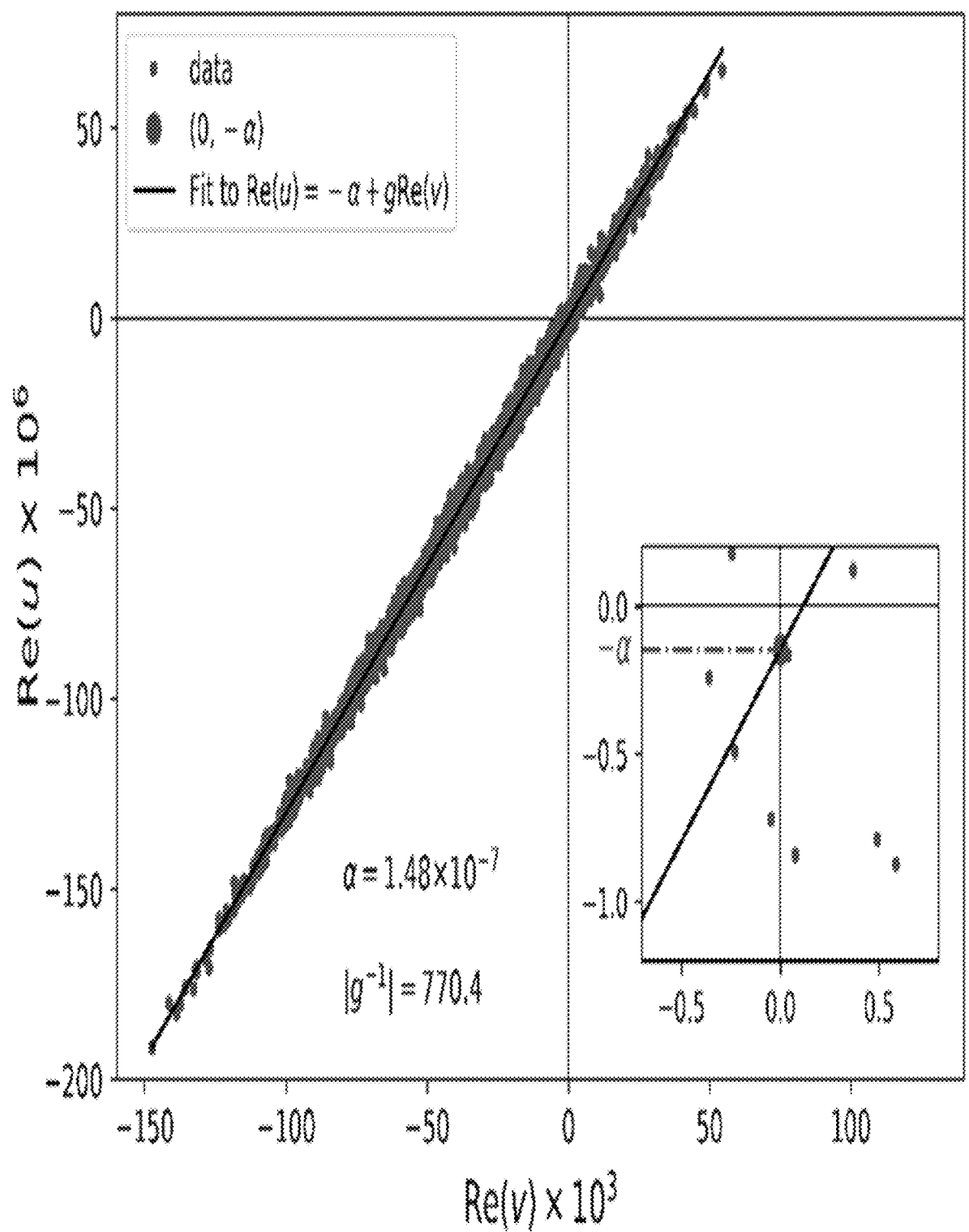
FIG. 15 shows a least-square line fitting of Re(u) vs Re(v), according to some embodiments.
Figure 16:
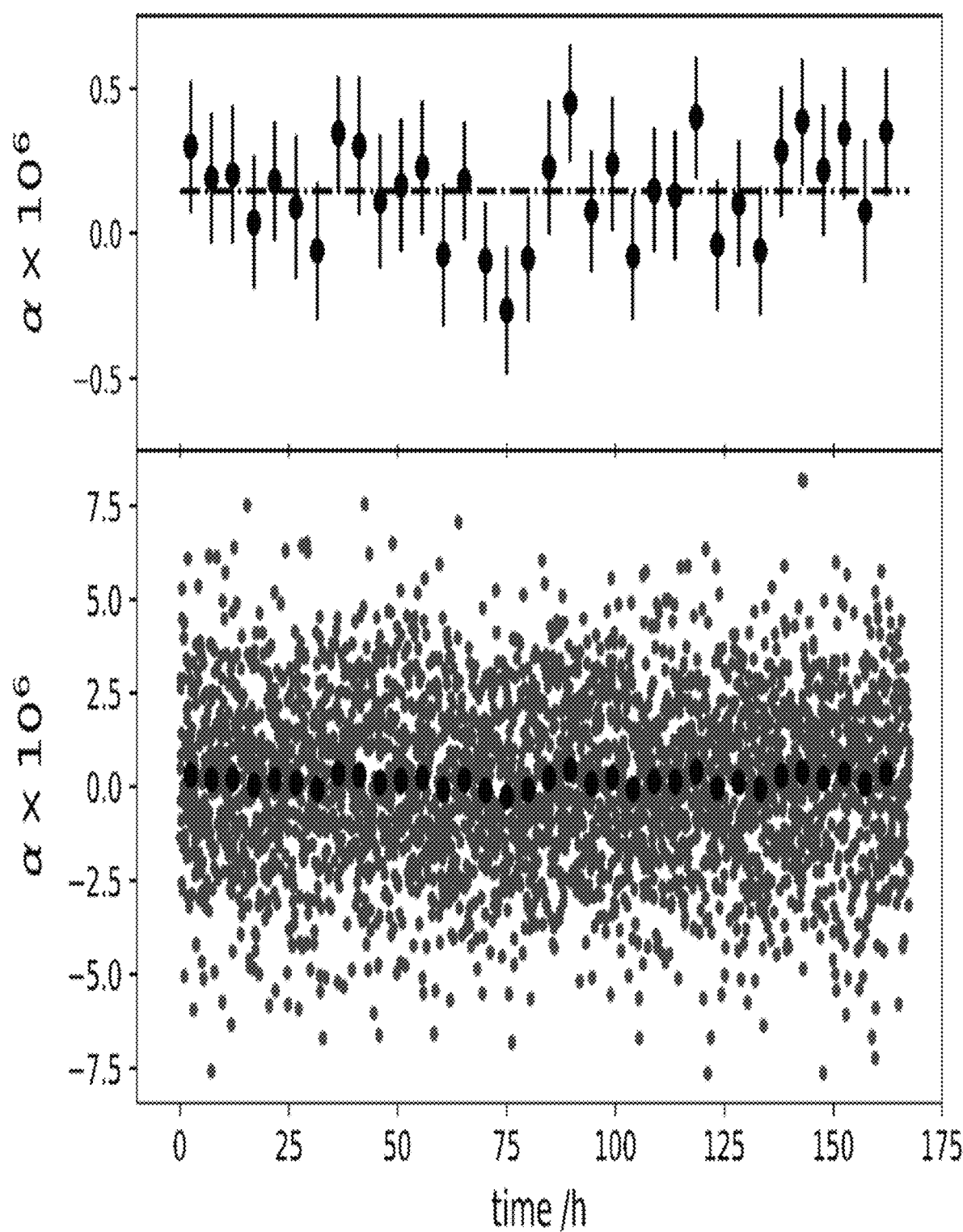
FIG. 16 shows determination of a at 1 kHz as a function of time, according to some embodiments. The black dots are obtained by averaging 100 points or about 5 hours' worth of data. The error bars denote the standard errors of the mean of each 100-point segment.

Plotting Re(u) versus Re(v) yields a linear relationship, and using a least-square line fitting, we can determine both g and an estimated value of α at 1 kHz as shown in FIG. 15. The magnitude of g, so determined, differs from its estimated value based on the specifications of the current amplifier by about 5%. This is not too surprising considering that the parameter g also includes the gain differences of the lock-in detectors. With g known, we can calculate a for each measurement by using $\alpha = -\text{Re}(u) + |g|\text{Re}(v)$, shown in FIG. 16. The distribution of the data points is consistent with a constant that is buried in white noise. Each data takes about 3 minutes to acquire, and all the data points stay within 8×10f. Averaging 100 points, or about 5 hours' worth of data, produces a new set of averaged data that fluctuates within $\pm 4\times 10^{-7}$ about their mean. The fluctuations can be attributed to the limited resolution of the ADC and the timing alignments of the three lock-ins.

Similarly, the imaginary component of (7) can be obtained by $$\beta = -\text{Im}(u) + |g|\text{Im}(v) \tag{12}$$

Figure 17:
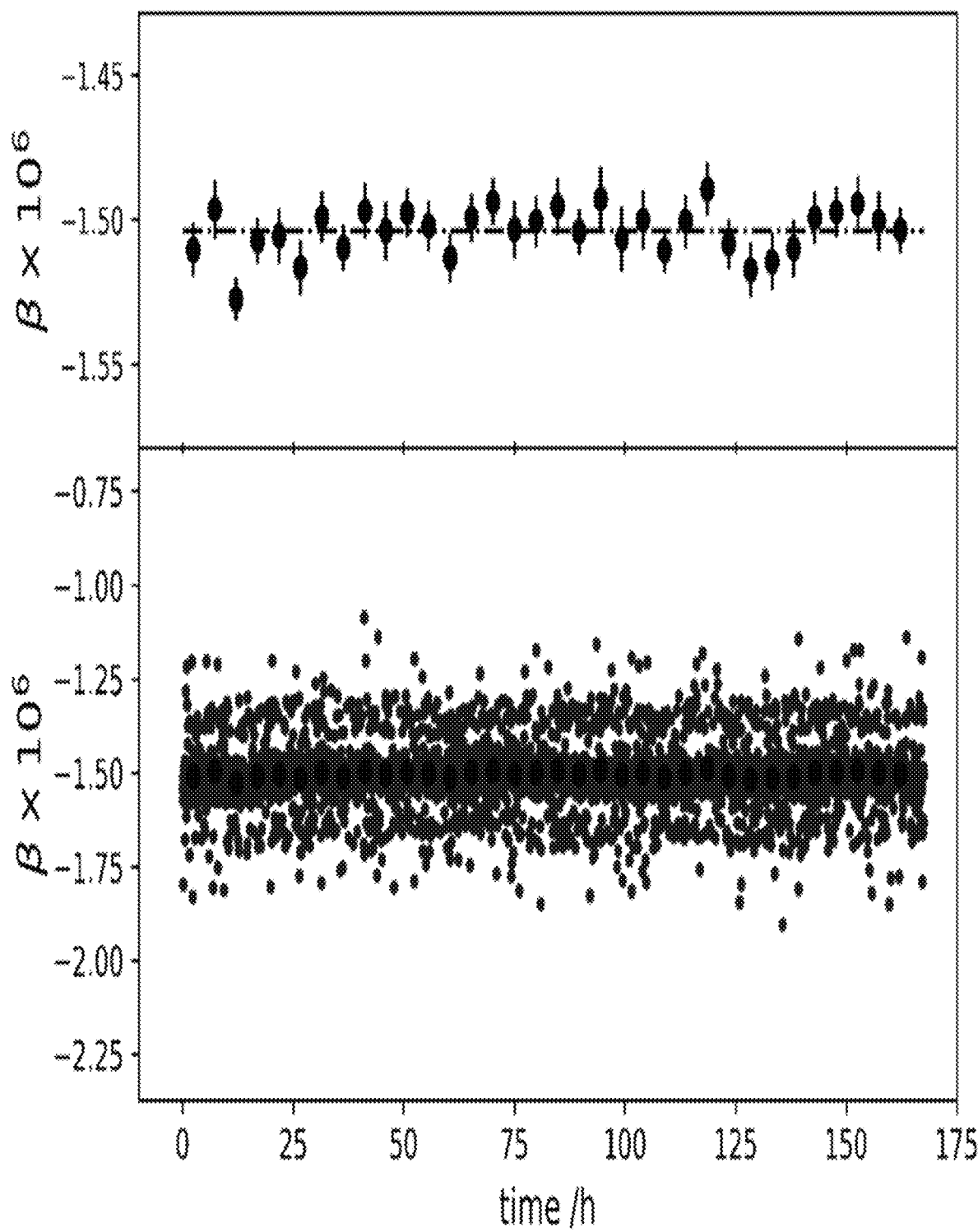
FIG. 17 shows determination of $\beta$ as a function of time, according to some embodiments. The black dots are obtained by averaging 100 points or about 5 hours' worth of data. The error bars denote the standard errors of the mean of each 100-point segment.

Shown in FIG. 17 is β as a function of time. Note that the vertical extents of the plots in FIG. 17 are one tenth of the corresponding plots in FIG. 16, clearly demonstrating less noise in the imaginary components, a consequence that the relative phase stability is better than the relative amplitude stability of the two sources.

Figure 18:
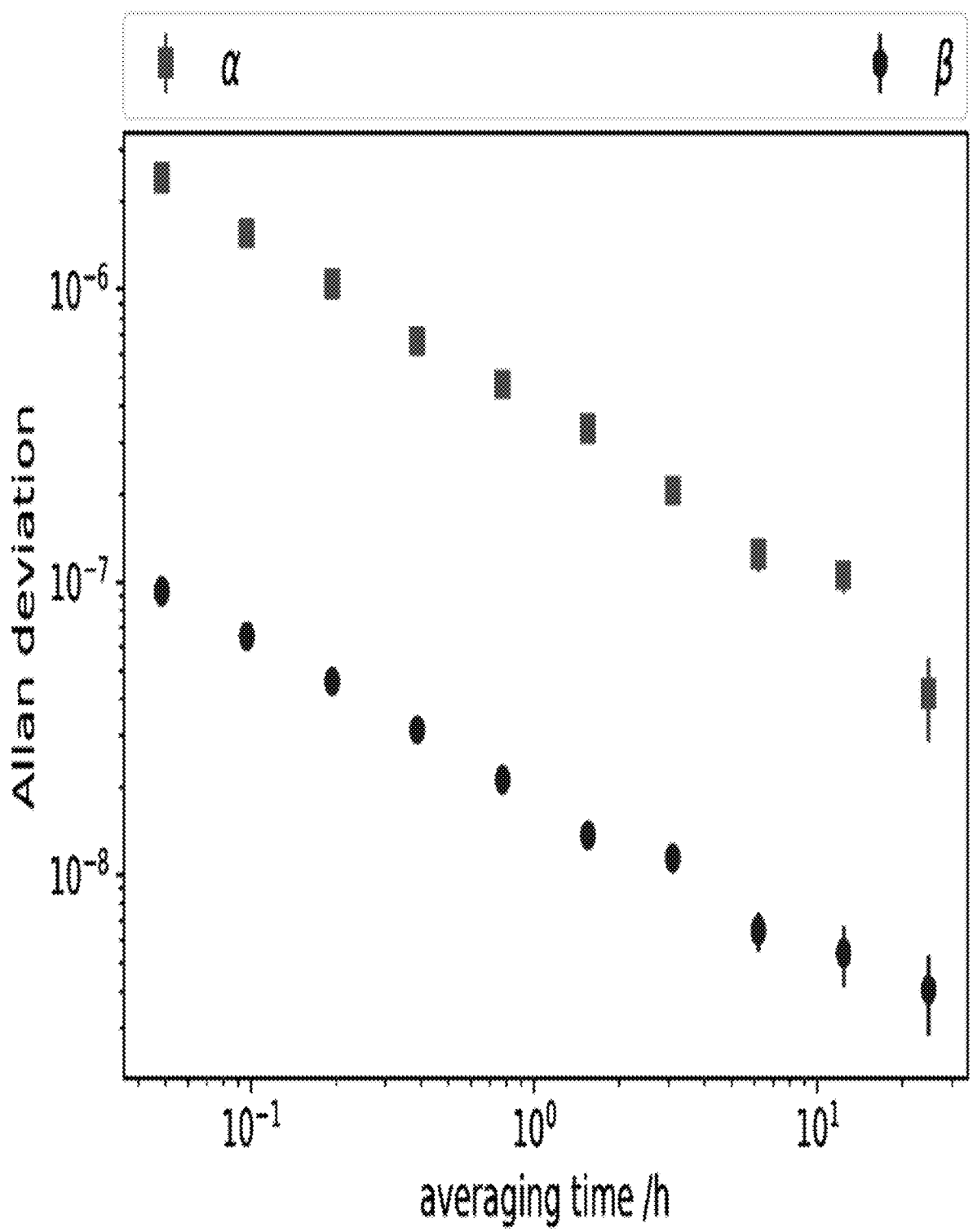
FIG. 18 shows Allan deviations of measured impedance ratio: solid squares for in-phase component, solid circles for quadrature, according to some embodiments.

The Allan deviations of the measured impedance ratio of $Z_1$ and $Z_2$, at 1 kHz and a rms value of 0.7071 V, are shown in FIG. 18. The Allan deviations of a decrease to below $10^{-7}$, demonstrating the stability of the digital bridge. The quadrature component shows lower deviations, demonstrating the excellent phase stability of the digital system.

Figure 19:
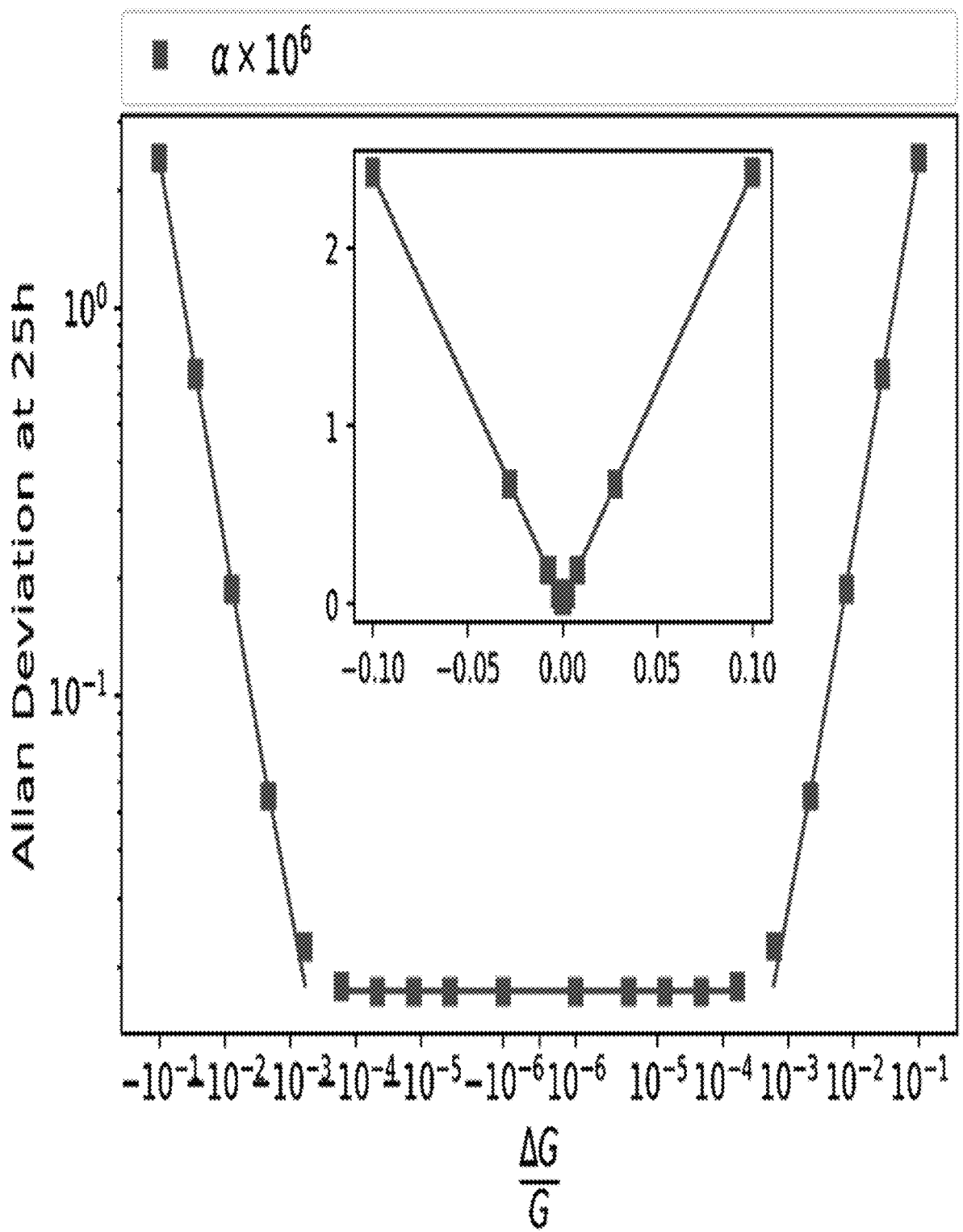
FIG. 19 shows Allan deviation of in-phase resistance ratio as function of $\Delta G/G$. The inset shows the same data on linear axes, according to some embodiments.

Effective cancellation of the source noise using (2) requires precise determination of G. The Allan deviation of the in-phase resistance ratio at 25 h is shown in FIG. 19 as a function of fractional magnitude change of G, ΔG/G, at constant phase. The log-log plot shows a broad bottom, indicating that the source noise is largely cancelled out, provided that the magnitude of G is determined within a factor of $10^{-3}$. The Allan deviation increases linearly with the magnitude of large ΔG/G, as shown in the inserted linear plot.

Figure 20:
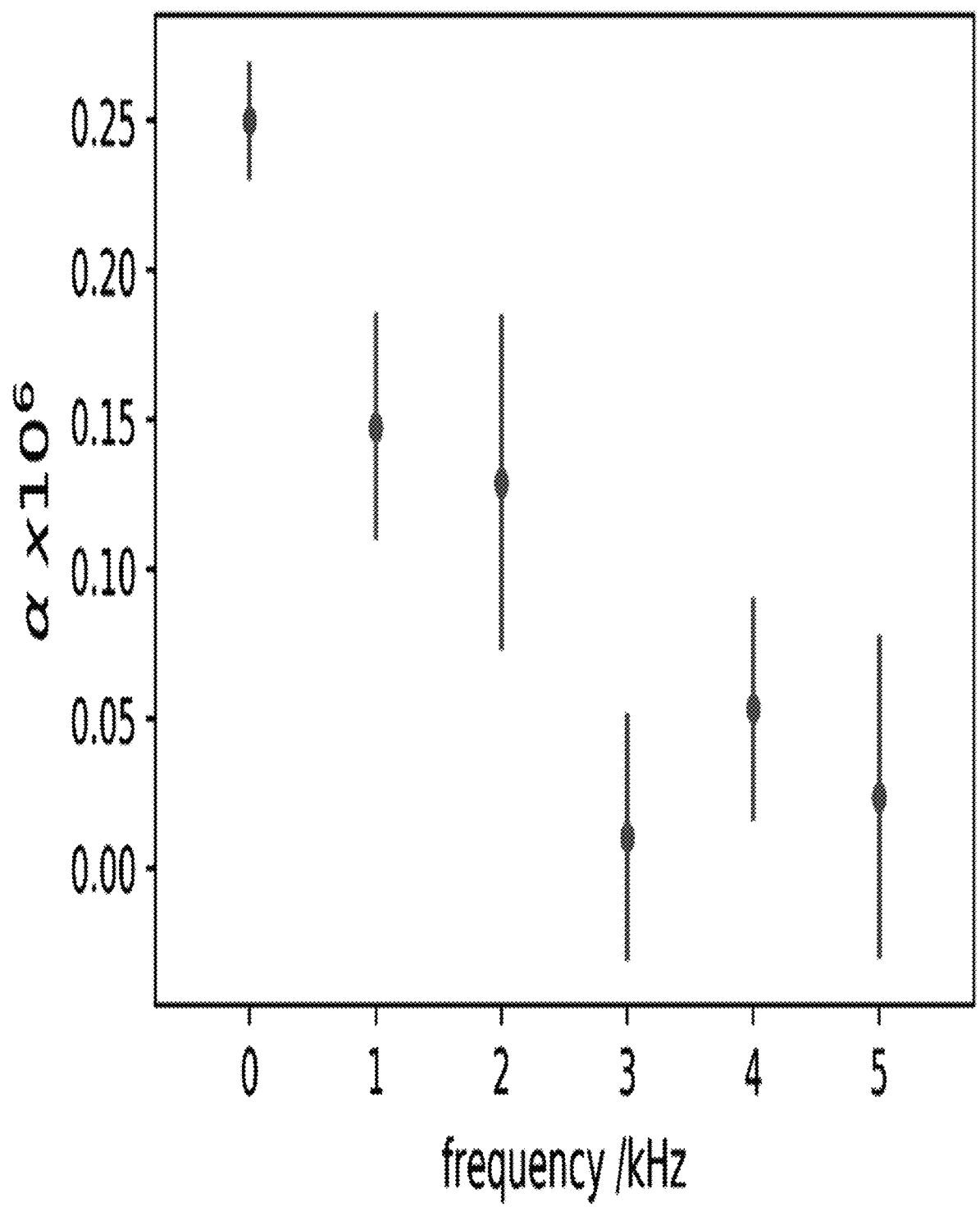
FIG. 20 shows measured $\alpha$ as a function of frequency (dark); dc value of $\alpha$ (light) shown for comparison, according to some embodiments.
Figure 21:
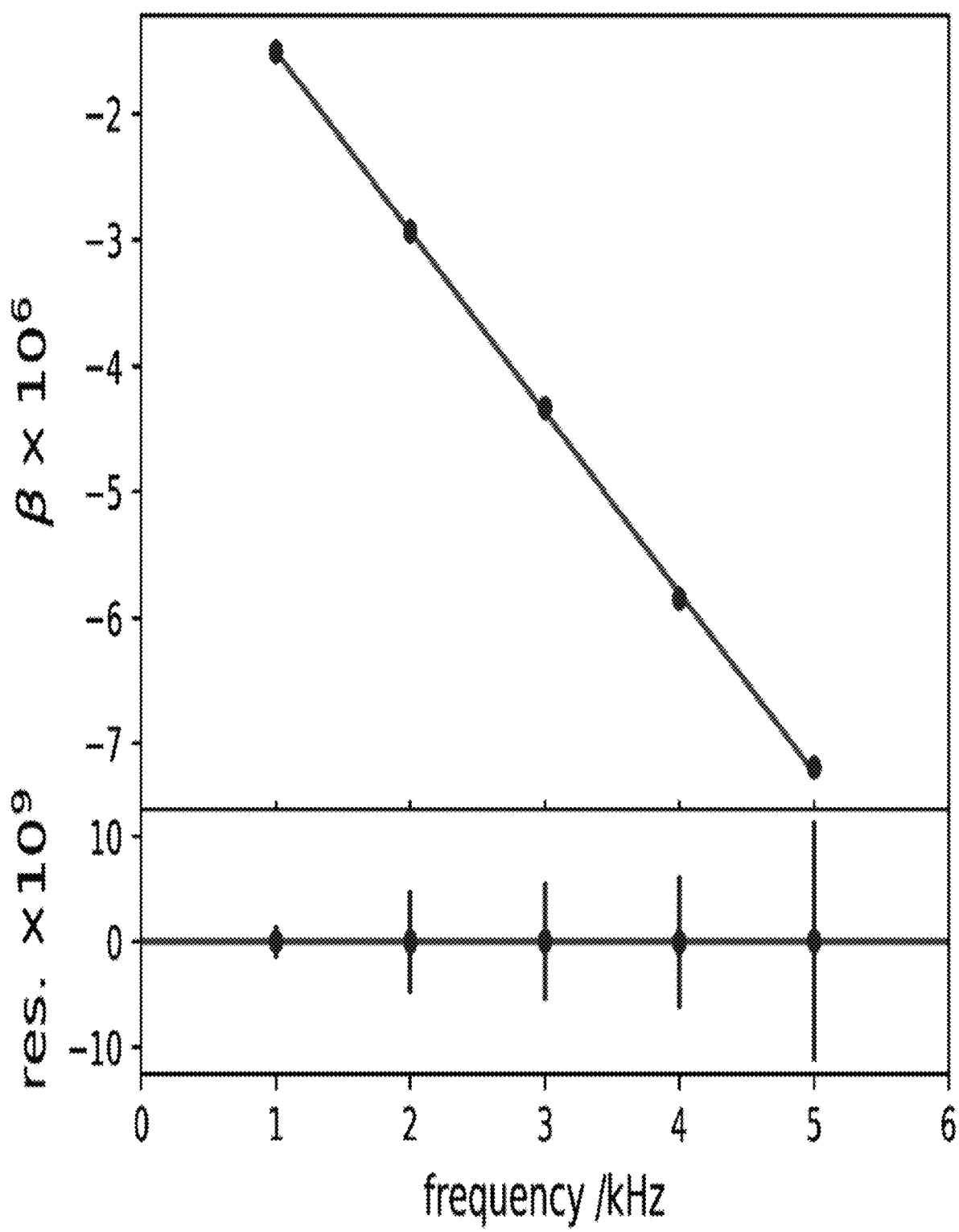
FIG. 21 shows measured $\beta$ as a function of frequency (top). Residual after fitting with a straight line (bottom), according to some embodiments.

Measurements of α from 1 kHz to 5 kHz are shown in FIG. 20. Its frequency dependence, based on the ac measurements alone, is buried in the fluctuations of Type-A noise. However, a comparison with the dc value of α also shown FIG. 20, which was measured with Measurements International 6010C, suggests that the two resistors may have a small difference of frequency dependence. A calibration obtained from the Physikalisch-Technische Bundesanstalt (PTB) for a similar Vishay resistor exhibits a linear frequency dependence of $0.25\times 10^{-6}$/kHz. Measured β as a function of frequency are shown in FIG. 21, exhibiting a linear frequency dependence which is consistent with a simple parallel RC model for the ac resistors under comparison. The parallel capacitances of the two ac resistors appear to be matched within 0.02 pF. Small residuals that can be seen in FIG. 21 after fitting with a straight line demonstrate again the excellent phase stability of the digital bridge.

We tested a digital impedance bridge using two nominally equal resistors to form a 1:1 ratio. In contrast to the conventional approach of emphasizing precision and stability of the voltage sources driving the bridge, we adopt an approach of focusing on resolution and stability of the detectors. Fluctuations of source voltages are largely removed through post-processing of the digitized data, and the measurement results are limited mainly by the detector noise.

Lock-in amplifiers are traditionally used to measure small ac signals, typically deviations from null in ac bridge applications. In this work, we demonstrated a system of using three lock-in detectors for measuring small deviations from the perfect ac ratio of unity magnitude, achieving stabilities and resolutions of a few parts in $10^7$ within a few hours for each point from 1 kHz to 5 kHz. Compared to the digital sampling bridge using the modified 3458A multimeters, the digital bridge based on the lock-in amplifiers, which require no modification, is easier to use, more robust for remote programming and controlling, and more readily applied over a wide frequency range. However, we have demonstrated a superior stability and resolution at 1 kHz using three 3458A multimeters for measurements of the voltage ratios, achieving a signal-to-noise ratio approximately one order of magnitude higher when compared over the same averaging time window with the lock-in system. In the future, we intend to continue experiments with this superior voltage ratio measurement system at other frequencies within the constraints of the equivalent-time sampling principles.

The 3458A-based bridge at 1 kHz provides a condition where the overall bridge resolution and stability (better than 1 part in $10^8$ in less than 15 min) are limited by the detectors rather than the excitation sources for the 1:1 comparisons of the two resistors. It should be mentioned that for future RC comparisons, where one of the sources is phase shifted, the effect of the 3458A's limited bandwidth needs to be carefully investigated because a purity of the source spectra can become critical due to aliasing. The 3458A-based system, however, cannot be easily extended to unique frequencies like 1592 Hz and 1233 Hz due to constrains of the equivalent-time sampling principles. In contrast, the lock-in system works at any frequency in the audio range, but it suffers from a higher level of detection noise, taking a few hours to achieve a few parts in $10^7$ Type A uncertainty. The detection noise can be attributed to the limited resolution of the ADC and the timing alignments of the three lock-ins which were implemented in the control software using a $M_1$-$M_2$-$M_3$-$M_2$-$M_1$ sequence for the data readings. This alignment method is valid within timing jitters of the communication bus and has the advantage of being easily implemented with most lock-in detectors. However, significant reduction of the detection noise can be achieved with a hardware-based timing alignment.

Example 3

Comparison of a 100 pF Capacitor with a 12906Ω Resistor Using a Digital Impedance Bridge. In this Example, numbering of equations begins from (1).

We tested a digital impedance bridge in a hybrid structure for comparison of a capacitor with a resistor where the impedance ratio was measured in two separate parts. The modulus of the impedance ratio was matched arbitrarily close to the input-to-output ratio, in magnitude, of a two-stage inductive voltage divider by adjusting the operating frequency of the bridge; the residual deviation between the two together with the phase factor of the impedance ratio was measured using a custom detection system based on a four-channel 24-bit digitizer. The ratio of the inductive voltage divider was calibrated, in situ, using a conventional four-arm bridge with two known capacitors. Fluctuations of the source voltages were largely removed through postprocessing of the digitized data, and the measurement results were limited by the digitizer error. We have achieved an overall bridge resolution and stability of 0.02 µF/F in 2 hours for measuring a 100 pF capacitor relative to a 12906Ω resistor at 1233 Hz. The relative combined standard uncertainty (k=1) is 0.13 µF/F, dominated by the digitizer error.

Digital techniques can be used to generate two synchronized ac voltages with a phase difference of $\pi/2$. The digital bridges, based on such ac sources, have the potential to simplify comparisons between a capacitor and a resistor. Precise measurements of such impedance ratios are critical to develop quantum-based impedance standards.

Figure 22:
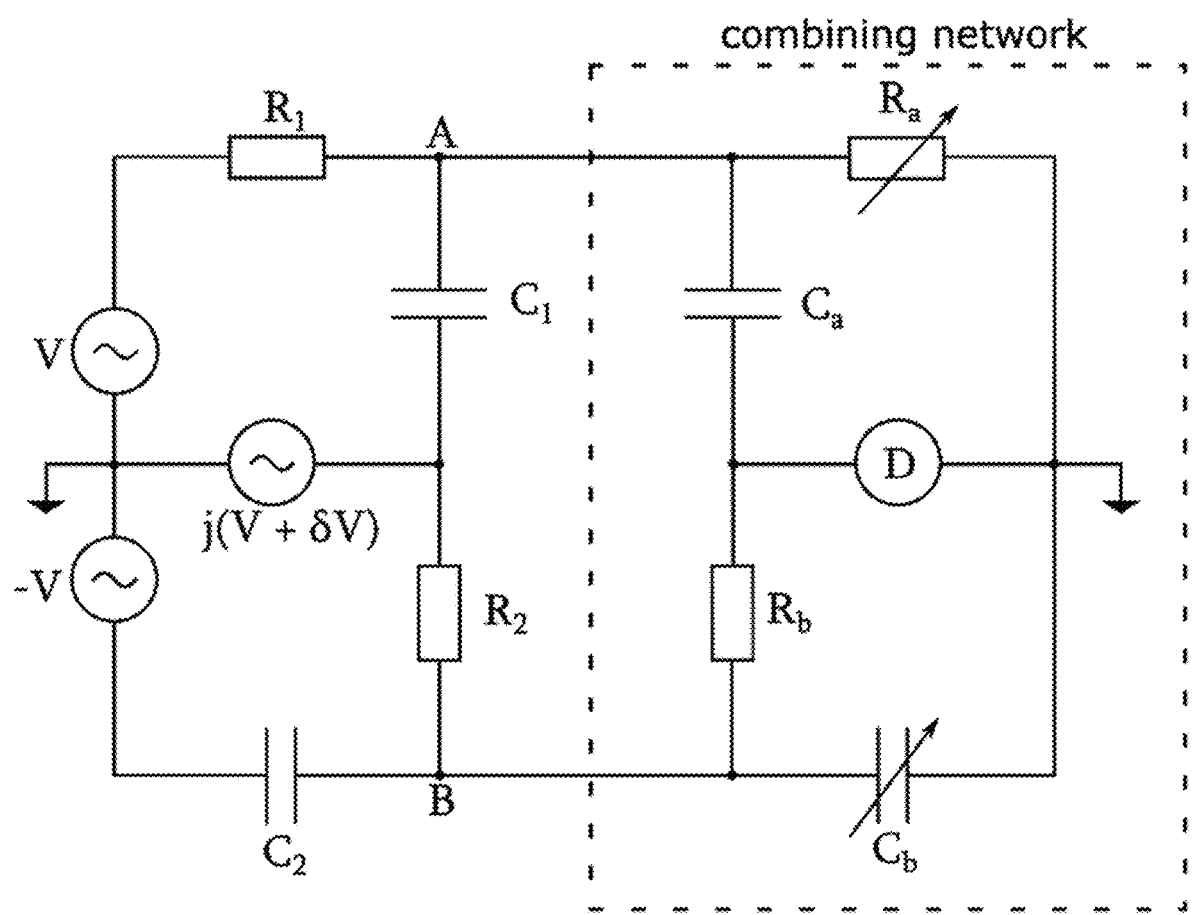
FIG. 22 shows a quad bridge with combining network, according to some embodiments.

When the voltage ratio of two synthesized sources is used directly as the reference for impedance ratio measurements, the stability of the voltage ratio can become a major limiting factor for the overall bridge performance. It appears that an underexplored research area is to mimic in the digital domains some analog techniques that are commonly used in the analog bridges to correlate and combine detector voltages, enabling suppression of the effect of source fluctuations. A quad bridge includes a complex impedance ratio of a resistor and a capacitor, with a phase of $\pi/2$, that cannot be measured with high accuracy with a single quadrature bridge because the required voltage ratio at a phase angle of $\pi/2$ cannot be accurately produced in an analog bridge. However, two such ratios in sequence, forming a double quadrature bridge with a total phase shift of $\pi$, can be measured with high accuracy using a transformer ratio as reference. It is important to observe that although the overall accuracy of a quad bridge can be very high, the error voltages of the individual quadrature bridges at points A and B (FIG. 22) fluctuate significantly due to the inevitable fluctuation of the quadrature voltage represented by $\delta V$. An elegant feature of the Quad bridge is to combine the error voltages with a RC combining network such that it forms, with the main bridge components, a twin-T network from the quadrature voltage to the detector, D; the twin-T network is a notch filter and can be adjusted so that D is immune to $\delta V$ at the fundamental frequency of the bridge excitation.

The quad bridge can be simplified using digital techniques. Specifically, if the detector voltages at points A and B (FIG. 22) are digitized, their correlation can be analyzed in post-processing and the function of the analog combining network can be replaced by software algorithms. One can further argue that if the detector voltage of a single quadrature bridge is synchronously digitized with the source voltages, their correlation can also be analyzed to suppress the source fluctuations. This paper describes our research in this direction, aiming to develop a simple digital bridge for RC comparisons.

Bridge Setup

Figure 23:
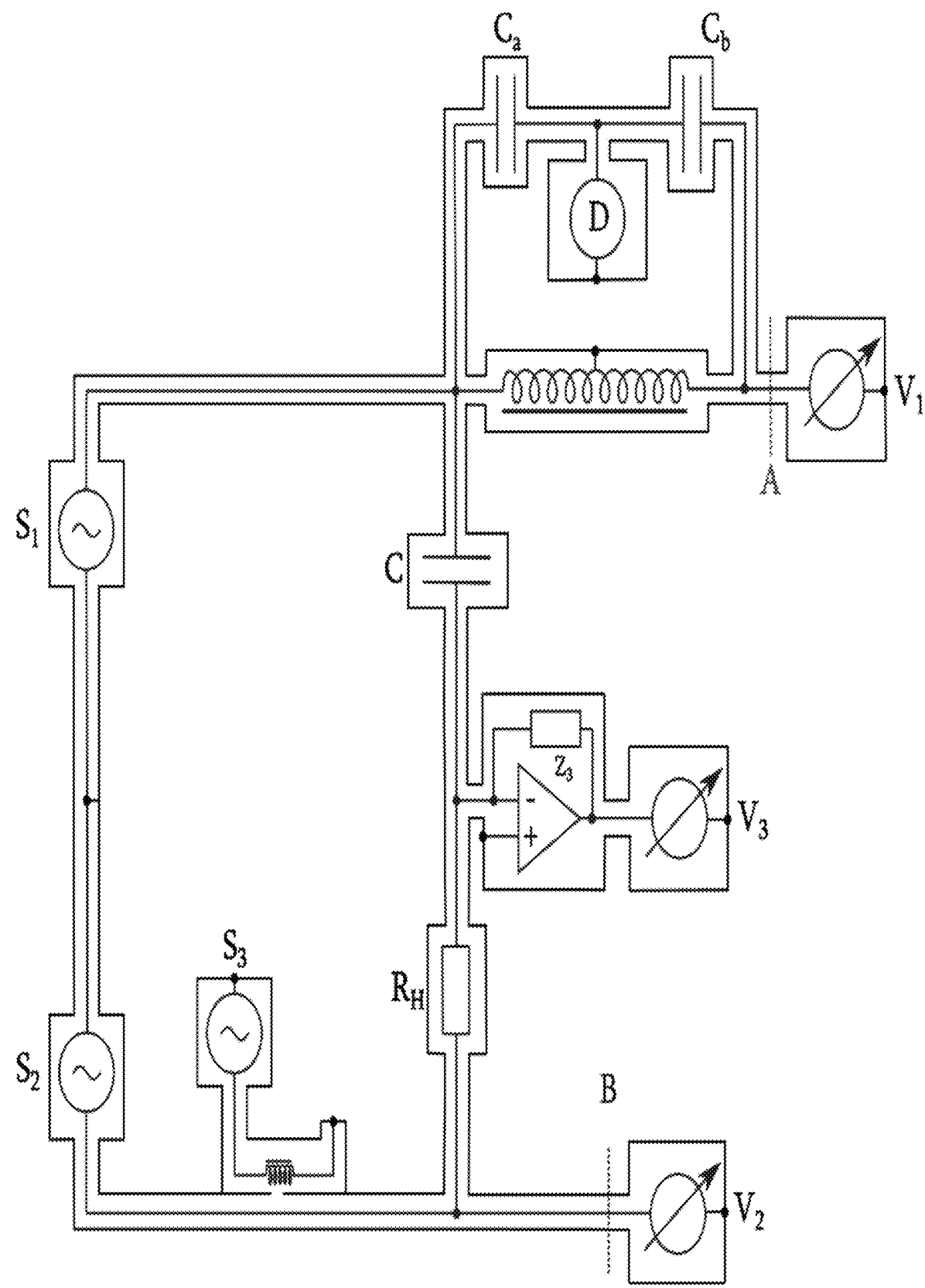
FIG. 23 shows a digital impedance bridge for comparison of $Z_1=(j\omega C)^{-1}$ with $Z_2=R_H$ (C=100 pF and $R_H$=12906Ω) at a frequency near 1233 Hz. $Z_3$ is the feedback resistor of the current amplifier. $S_1$ (Amplitude=10 V, Phase=90°), $S_2$ (Amplitude=0.1 V, Phase=0), and $S_3$ are waveform generators. V1, V2 and V3 are ac voltmeters. V1 (Amplitude=0.1 V, Phase=−90°) and V2 (nominally, Amplitude=0.1 V, Phase=0) are connected to the high-potential ports (A and B) and are periodically switched to minimize the effect of their gain drift. $S_3$ is adjusted such that V3 is nominally 0. Coaxial chokes (omitted for clarity) are placed in every unwanted loop in the bridge circuit, according to some embodiments.

The digital impedance bridge, shown in FIG. 23, is designed for comparisons between a 4TP resistor, with a nominal value of $R_H$=12906Ω, in an air bath at 23° C., and a two-terminal-pair (2TP) Andeen-Hagerling capacitor, with a nominal value of C=100 pF. The impedance of the capacitor and the resistor are represented with $$Z_1 = \frac{1}{i\omega C} \text{ and } Z_2 = R_H,$$

respectively, and the associated impedance ratio is represented by a complex number, $$re^{j\theta} = \frac{Z_1}{Z_2}.$$

The low port of the 2TP capacitor was connected directly to the low-current port of the resistor without a combining network by following comparing 4TP resistors with 2TP capacitors. A current amplifier with transimpedance of $Z_3$, which is used to detect the bridge error voltage, was connected to the low-potential port of the 4TP resistor. Hence, the cable and the contact resistance between the low-current port of the resistor and the low port of the 2TP capacitor were then considered part of the capacitance standard. As long as the defining planes are applied consistently in calibrations, the inclusion of contact resistance only affects the dissipation factor of the capacitor slightly, with a negligible contribution to the uncertainty of the capacitance measurements.

We used two phase-locked channels ($S_1$ and $S_2$) of a waveform generator as the main sources to excite the bridge through a 2TP current loop connecting to the high-current ports of $Z_1$ and $Z_2$, applying root mean square (rms) voltages of 7.07 V and 70.7 mV, respectively, to the capacitor and the resistor at a frequency near 1233 Hz. To overcome the limited resolutions of the generator outputs, another synchronized generator ($S_3$) was used to inject a fine adjustment signal through a 10000:1 injection transformer inserted into the lower excitation arm. An external time base was used for both generators with their 10 MHz reference signal locked to the Global Positioning System.

The modulus of the nominal impedance ratio is 100. To avoid the digitizer nonlinearity of sampling the excitation voltages with different amplitudes, a two-stage inductive voltage divider (IVD), with its input-to-output ratio, $k_o$, having a nominal value of −100, was added between the high port of the capacitor and the voltage measurement system. The operating frequency of the bridge was fine-tuned such that the modulus of the impedance ratio, r, was arbitrarily close to $k_o$ in magnitude and the sampled $V_1$ and $V_2$ were nominally equal in amplitude. The IVD ratio may slightly depend on the loading condition and therefore was calibrated, in situ, using a conventional four-arm bridge with two capacitors, $C_a$ and $C_b$, of nominal values of 1 pF and 100 pF, respectively. A small micrometer-controlled trim capacitor added in parallel to $C_b$ was used to null the in-phase component of the bridge error.

The IVD output (A) and the low-potential port (B) of $Z_2$ form a 2TP potential loop of a digital bridge with two voltage detectors through a custom coaxial switching fixture. The two detectors were periodically interchanged to minimize the effect of their gain drift. A small loading change at A and B is equivalent to a small change of the excitation voltage ratio, which is suppressed in the digital domain by correlation with the bridge error signal.

We used a four-channel 24-bit digitizer module in a data acquisition system to simultaneously sample $V_1$, $V_2$, and $V_3$, preserving the relative phase difference of the three signals. The digitizer was set with a differential input, a sampling rate of 800,000 samples per second, and a record length of 2,400,000 samples for each measurement. The analog bandwidth of the digitizer is approximately 125 kHz. The amplitude and the phase of each sampled voltage were determined using an algorithm of three-parameter least squares fit as described in IEEE Standard 1057-2017.

The digital bridge (FIG. 23) relies on accurate measurements of voltage ratios to determine the phase factor of the impedance ratio, $e^{j\theta}$. In the ideal case, the excitation sources would be adjusted to balance the bridge, such that for any measured voltage, $V_2$, at the high-potential port of $Z_2$, the measured voltage, $V_1$, which is scaled down by the IVD from the high-potential port of $Z_1$, would be equal to a perfect value $V_{1p}$, achieving the condition of equal current through the two impedances under comparison. The balance equation is $$\frac{Z_1}{Z_2} = -\frac{k_o V_{1p}}{V_2} \tag{1}$$

In practice, the balance is never perfect, and the source drift always exists. The combined effect can be represented by an error voltage, $\delta V$, superimposed on the ideal voltage $V_{1p}$, and we have $V_1 = V_{1p} + \delta V$. The effect of the error voltage is automatically balanced through the feedback resistor $Z_3$ of the current amplifier. The common low-potential port is kept at virtual ground, and the detected error voltage, $V_3$, relates to $\delta V$ through:

$$\frac{Z_1}{Z_3} = -\frac{k_o \delta V}{V_3} \tag{2}$$

The phase difference between $V_3$ and $\delta V$ is approximately 90°. We define the gain factor $$g = \frac{j}{k_o} \frac{Z_1}{Z_3}.$$

Hence, $j\delta V + g V_3 = 0$. The bridge dynamics can be understood as a superposition of the two voltage-balancing actions governed by (1) and (2).

Equal Voltage Test

The measurement accuracy of the DAQM909A for ac voltage ratios depends on not only the resolution of the digitizer but also the gain stability of the input amplifiers. To determine the limitations of the digitizer, we connected two input channels of a DAQM909A in parallel to the same sinewave voltage, with an rms value of 0.1 V at 1 kHz. Results were obtained when the two input channels, set at the 0.3 V input range, were periodically interchanged through the coaxial switching fixture, creating two virtually identical digitizing channels. The Allan deviation of the measured unity voltage ratio as a function of the averaging time follows a straight line in a log-log plot, with its slope consistent with averaging over white noise. It reaches below 0.01 µV/V in approximately four hours, about a factor of 10 lower than what was achieved using the SR860s.

Digitized Bridge Voltage

Figure 24:
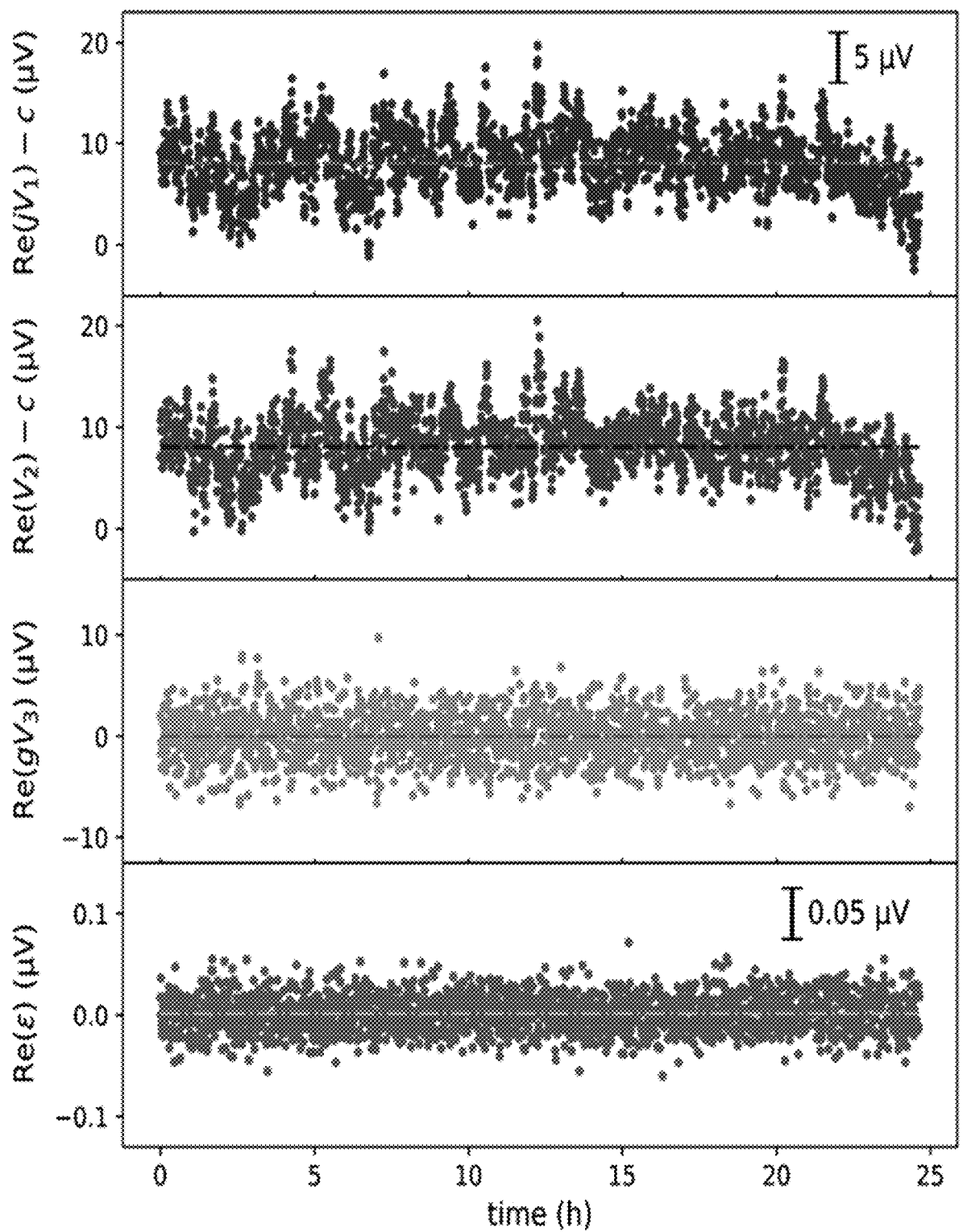
FIG. 24 shows real components of recorded voltages as a function of time: (1) $jV_1$, (2) $V_2$, (3) $V_3$ scaled with the gain factor, (4) $\varepsilon$. $jV_1$ and $V_2$ are shifted by $c=10^5$ μV, according to some embodiments.
Figure 25:
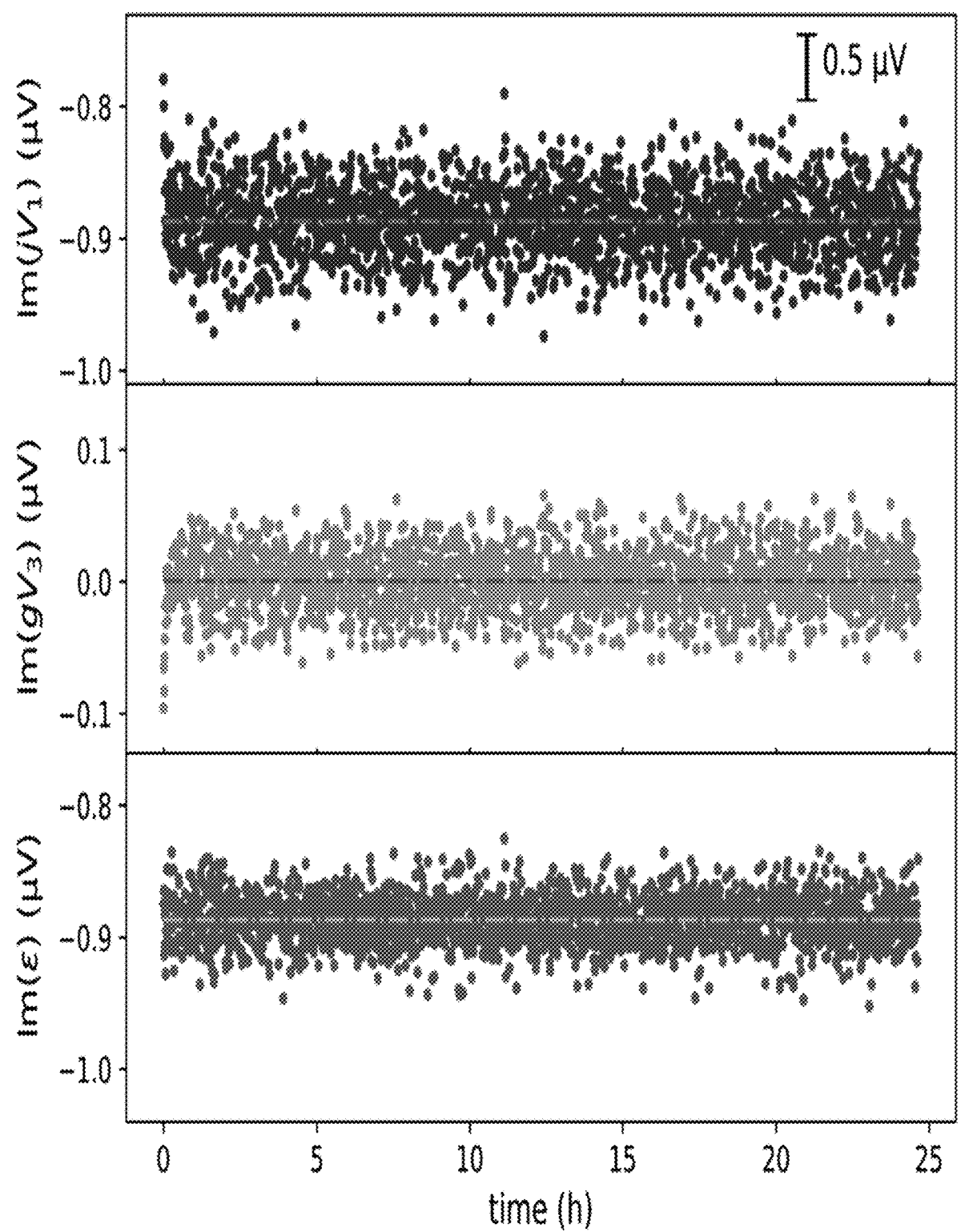
FIG. 25 shows imaginary components of recorded voltages as function of time: (1) $jV_1$, (2) $V_3$ scaled with the gain factor, (3) $\varepsilon$, according to some embodiments.

An advantage of the digital bridge is that the excitation voltages and the error signal can be fully digitized, and the bridge dynamics can be analyzed in postprocessing. Test results presented herein were acquired with the bridge setup shown in FIG. 23. The gain of the transimpedance amplifier was set at $10^7$ V/A, and the corresponding $Z_3$ was approximately 10 MΩ; the 3 dB bandwidth at this setting is 50 kHz. FIG. 24 and FIG. 25 show the measured $V_1$, $V_2$, $V_3$ values, and the bridge error voltage, E, as a function of time that were acquired with $S_1$ and $S_2$ set at 1233.19734 Hz, a phase of 90° and 0°, and an amplitude of 10 V and 0.1 V, respectively. The complex amplitude of $S_3$ set at the same frequency was automatically controlled through a computer to minimize the mean bridge error ($V_3$), using a simple proportional-integral feedback algorithm.

The phase difference between $V_1$ and $V_2$ is approximately −90°. The digitized voltages are phase normalized such that the phase of $V_2$ is 0. Their complex components are more conveniently compared between $jV_1$ and $V_2$. The real parts of $jV_1$ and $V_2$ (FIG. 24) fluctuated, on the order of 10 µV, exceeding a factor of 10 more than the imaginary counterparts (FIG. 25). This reflects that the digital sources have better phase stabilities than amplitude stabilities. The real component of $V_2$ closely follows that of $jV_1$, resulting from the feedback action that minimizes the bridge error signal.

For comparison, the error voltage $V_3$ is shown after being scaled with an estimated gain factor. $\mathrm{Re}(gV_3)$ is dominated by white noise, and its mean is effectively locked to 0 through the feedback (FIG. 24). The fluctuations of $\mathrm{Im}(gV_3)$ form a mirror image of $\mathrm{Im}(jV_1)$, with its mean also locked to 0 (FIG. 25).

We can qualitatively understand how the detected error voltage $V_3$ relates to the source fluctuation $\delta V$ by considering that the transimpedance amplifier together with $Z_1$ and $Z_2$ form a summing amplifier. Since $Z_1/k_o$ and $Z_2$ are nominally equal in magnitude and differ by 90° in phase, we have $V1+jV_2 \approx -\delta V$. We define $$\varepsilon = j\delta V + gV_3 \quad (3)$$

The real and imaginary components of E are shown in FIG. 24 and FIG. 25, respectively. Both components follow a white noise distribution, with a standard deviation of less than 0.05 µV, indicating a strong correlation between $\delta V$ and $gV_3$.

Correlation Analysis and Noise Cancellation

To analyze the dynamics of the bridge balancing more rigorously, we applied Kirchhoff's law to the bridge circuit:

$$\frac{k_o V_1}{Z_1} + \frac{V_2}{Z_2} + \frac{V_3}{Z_3} = 0 \quad (4)$$

Define α and β as the real and imaginary part of the deviation, respectively, from the nominal impedance ratio that is perfectly matched to the IVD ratio in magnitude:

$$\frac{Z_1}{Z_2} = \lambda(1 + \alpha + j\beta) \quad (5)$$

where $\lambda = jk_o$.

Combining (4) and (5), we rewrite:

$$1 - \frac{jV_1}{V_2} = -\alpha - j\beta - \frac{1}{\lambda}\frac{Z_1}{Z_3}\frac{V_3}{V_2} \quad (6)$$

Define:

$$u = 1 - \frac{jV_1}{V_2} \quad (7)$$

$$V = \frac{V_3}{V_2} \quad (8)$$

Eq. (6) becomes:

$$u = -\alpha - j\beta + gv \quad (9)$$

Using a linear fitting between the complex variables u and v, we can determine g. We then have $$\alpha = \mathrm{Re}(gv - u) \quad (10)$$

$$\beta = \mathrm{Im}(gv - u) \quad (11)$$

Figure 26:
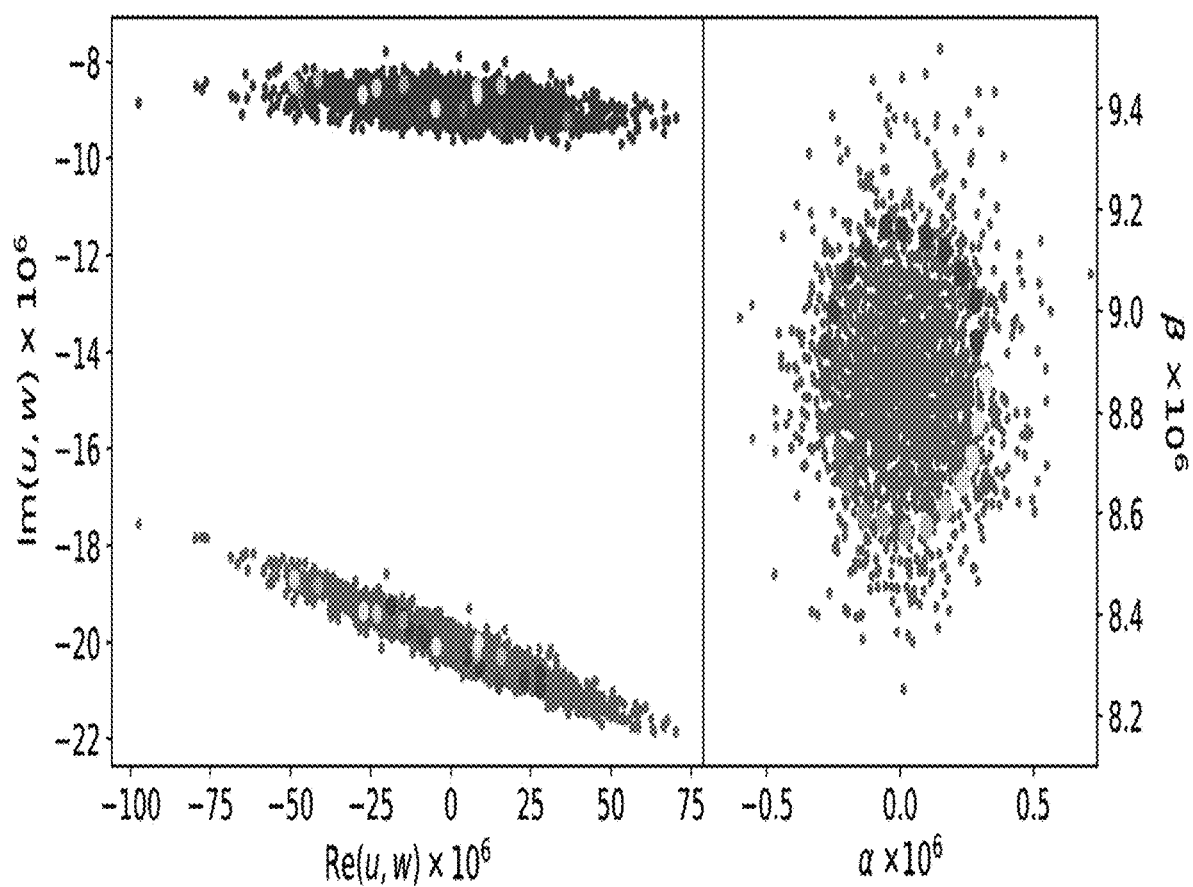
FIG. 26 shows, according to some embodiments: (a) imaginary part versus real part: u in light blue and w in cyan. w shifted lower by $j20\times10^{-6}$ for clarity; and (b) $\beta$ versus $\alpha$. 24 data points of the fitting residuals distributed close to the perimeter of a circle are colored progressively in (b); the corresponding u and w points in (a) show their correlation.

To visualize the effectiveness of the linear fitting, we plot the imaginary part versus the real part for u and w=|g|v in FIG. 26(a). The natural fluctuation of u is mainly along the real axis, covering a range of about 150 µV/V, reflecting that the digital sources have better phase stabilities than amplitude stabilities. The pattern of w is similar to that of u, except that it is tilted due to a phase shift of the current amplifier. The residuals of the linear fitting can be seen in FIG. 26(b), showing α versus β. The residual data points distribute tightly in a circle of radius about 0.5 µV/V, indicating that the fluctuations of u and v largely cancel out in determining α and β.

Figure 27:
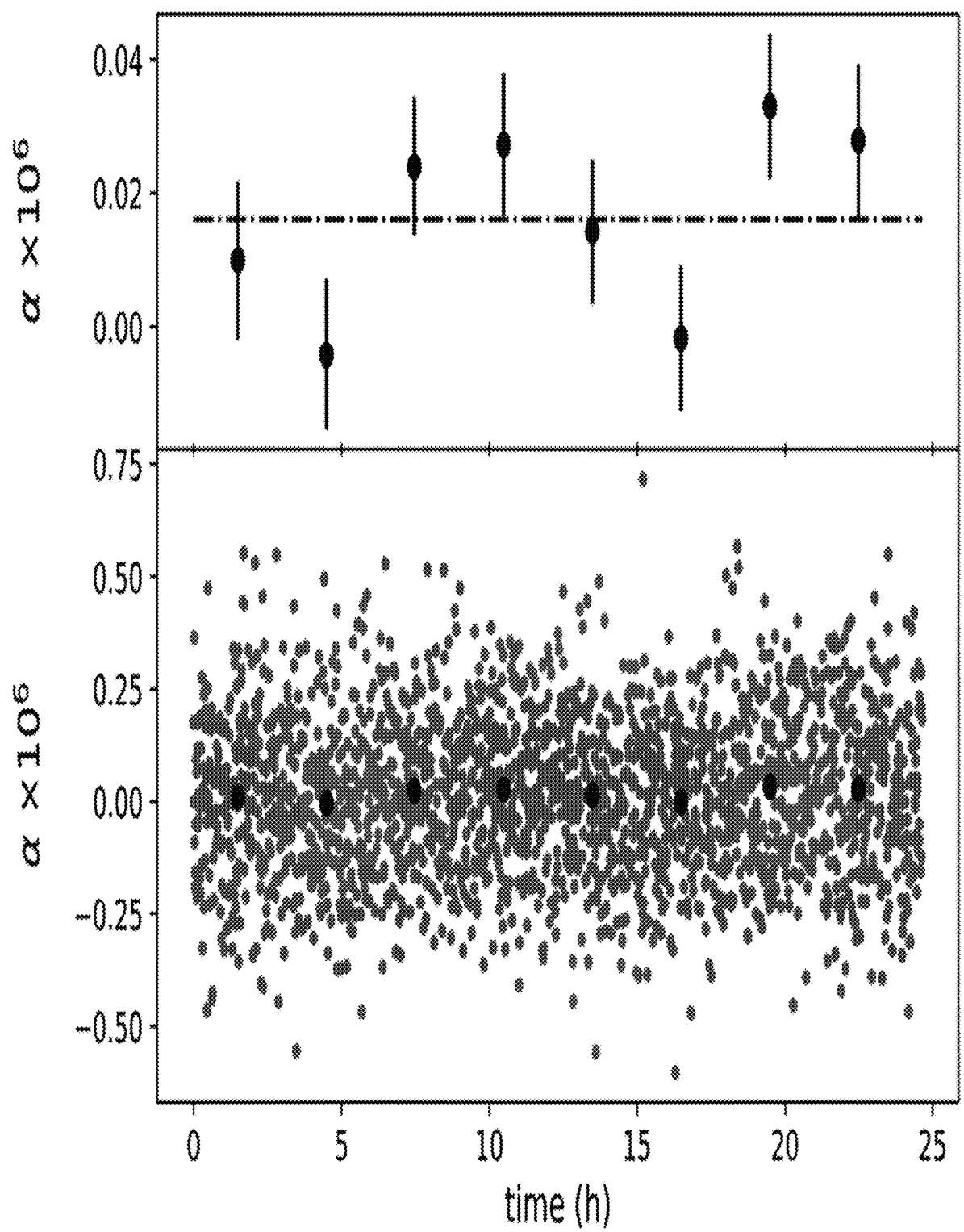
FIG. 27 shows, according to some embodiments, determination of $\alpha$ as a function of time. The black dots were obtained by averaging 256 points, or about 2 hours' worth of data. The error bars in the top graph denote the 1−σ standard deviation of the 256 points.

FIG. 27 shows α as function of time over a period of 24 hours. The distribution of the data points is consistent with a constant that is buried in white noise. Each data point in the lower panel takes about 36 s to acquire, and all the data points stay within $\pm 0.7 \times 10^{-6}$. Averaging 256 points, or about 2 hours' worth of data, produces a new set of averaged data that fluctuates within $\pm 0.02 \times 10^{-6}$ about their mean. The fluctuations can be attributed predominantly to the limited resolution of the digitizer.

Figure 28:
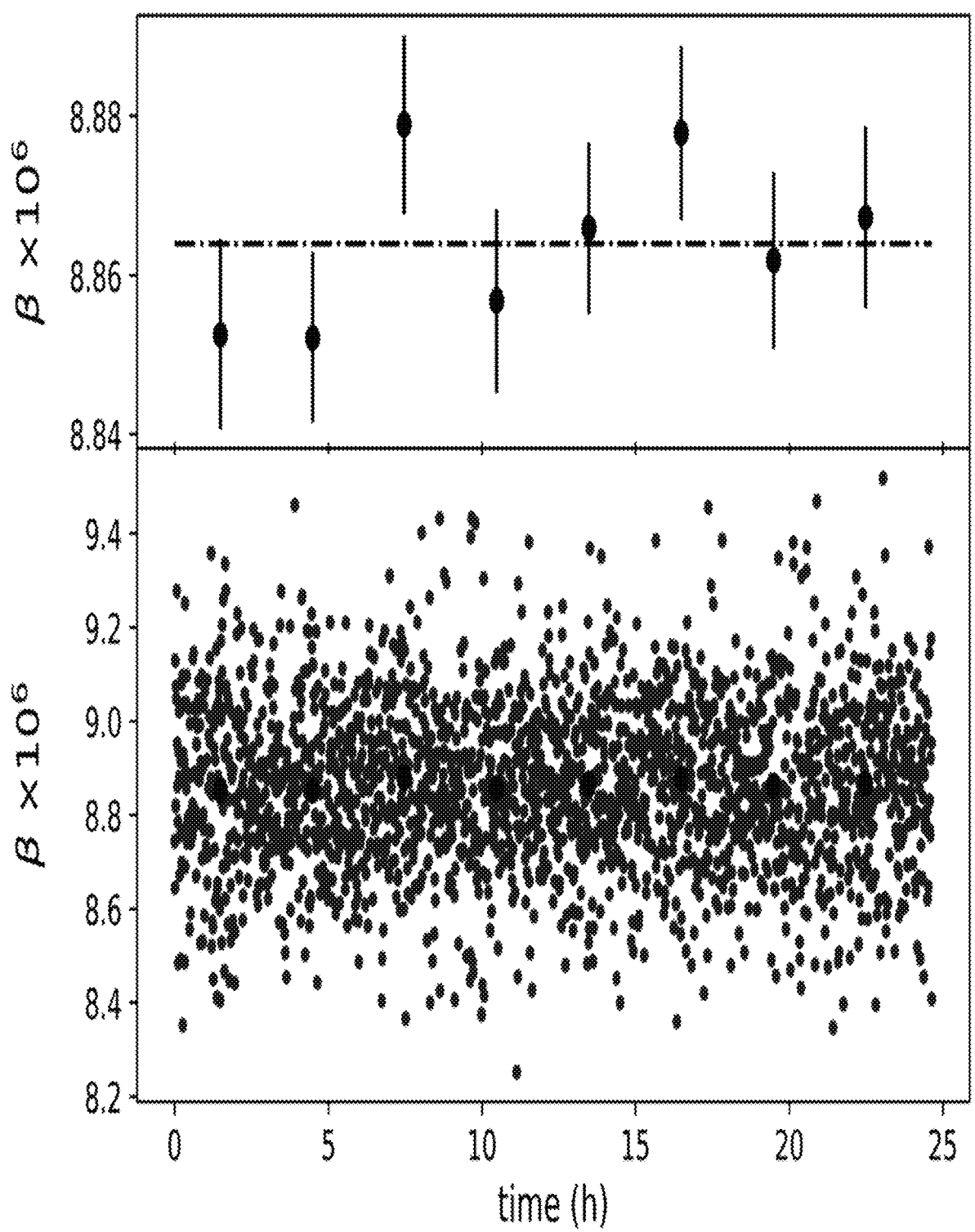
FIG. 28 shows, according to some embodiments, determination of $\beta$ as a function of time. The black dots were obtained by averaging 256 points, or about 2 hours' worth of data. The error bars in top graph denote the 1−σ standard deviation of the 256 points.

FIG. 28 shows β as a function of time over the same period. The distribution of the data points of β are similar to α and also consistent with a constant value over time. All the data points stay within $\pm 0.7 \times 10^{-6}$. Averaging 256 points also produces a new set of averaged data that fluctuates within $\pm 0.02 \times 10^{-6}$ about their mean.

Figure 29:
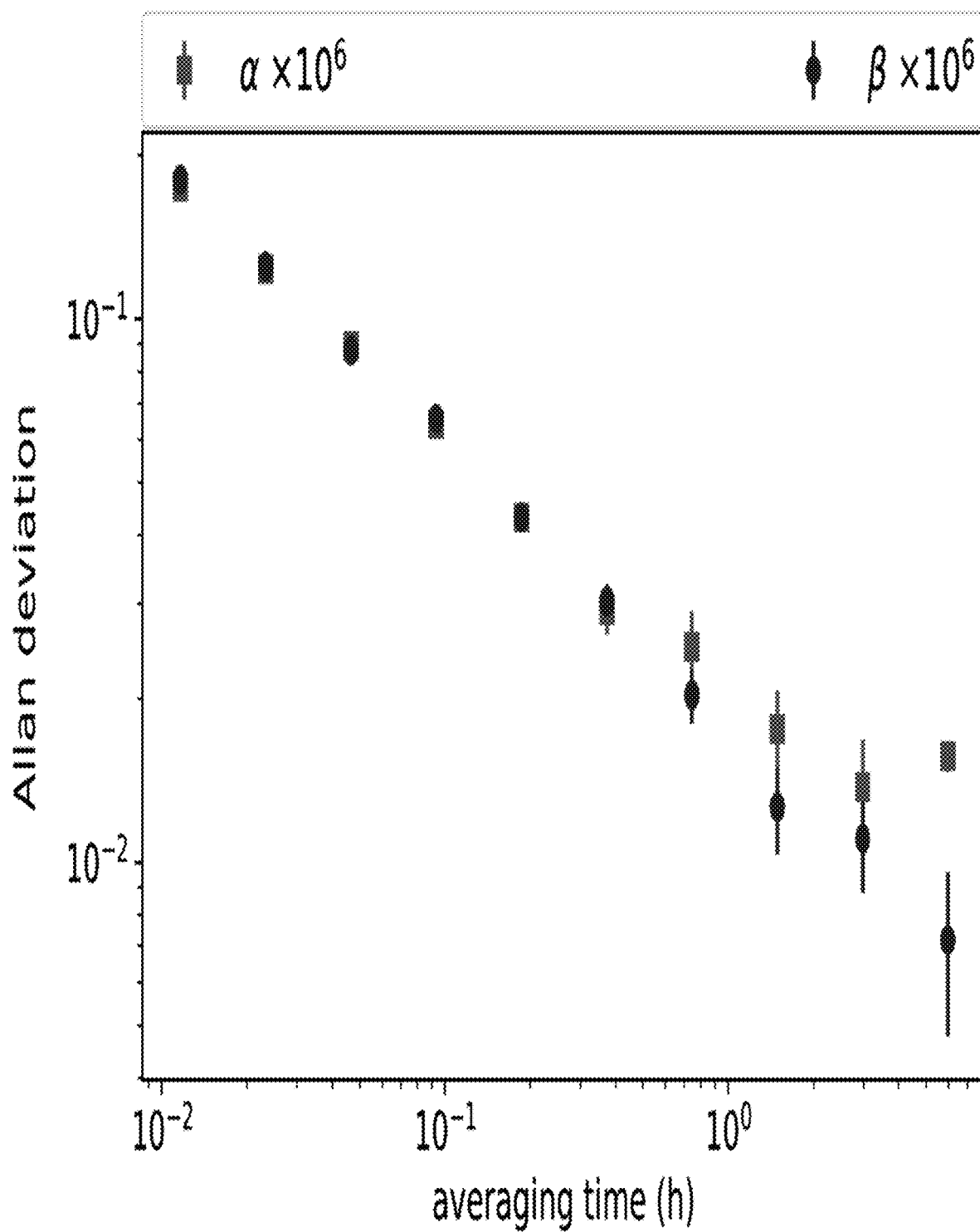
FIG. 29 shows the real part (squares) and imaginary part (circles) of the deviation from the nominal impedance ratio, according to some embodiments. Error bars are 1−σ standard deviation of the Allan deviation.

The Allan deviations of α and β are shown in FIG. 29. Both decrease to $2 \times 10^{-8}$ level in about 3 h and show a monotonic downward trend over the test time window, demonstrating the stability of the digital bridge.

Uncertainty Analysis

The digital impedance bridge enables us to measure the capacitance of C in reference to $R_H$ with a Type A uncertainty (k=1) of 0.02 µF/F. Repeated measurements show that the results of C using the digital bridge are consistent, within 0.11 µF/F, with its capacitance measured against the Farad Bank, which is used to maintain the capacitance unit at the National Institute of Standards and Technology (NIST) and is traceable to the calculable capacitor. The difference can be partly attributed to the frequency dependence of C because the digital bridge functions near 1233 Hz to keep the impedance ratio close to 1001 in magnitude while the capacitance measurement relative to the Farad Bank has been restricted to 1592 Hz. However, the largest uncertainty source for the digital bridge is the digitizer error as shown in the Table 1 that includes the uncertainty budget for k=1.

TABLE

| | Relative standard uncertainty (×10⁻⁶) |
|---|---|
| Type A | 0.02 |
| Digitizer error | 0.10 |
| Frequency dependence of $C_a$ (1 pF) and $C_b$ (100 pF) | 0.07 |
| $C_a$ and $C_b$ relative to Farad Bank | 0.03 |
| $R_H$ relative to dc QHR | 0.01 |
| Frequency dependence of $R_H$ | 0.01 |
| Relative combined standard uncertainty | 0.13 |

The digital errors associated with the digitizer may arise from aliasing and spectral leakage. Stray capacitances in the digitizer may also cause crosstalk between the ADO channels and leakage to the ground. These errors have been estimated experimentally and numerically by varying the sampling rate and the record length, combined with temporarily introducing extra cross capacitances and changing from the differential input mode to the single-ended mode. Sensitivity to harmonics has been estimated experimentally and numerically by including selected harmonic base functions in the sine fit, adding simulated harmonic content to the digitized data record before the sine fit, and physically injecting additional third harmonic voltage into the bridge excitation. Possible offset error in the detected V3 due to non-linearity of the current amplifier and the ADC, causing intermodulation distortion, was also accessed by changing the gain settings of the amplifier and the ADC; no correlated change was detected within the limit of the bridge resolution.

The front analog circuit of the digitizer can be modified to reduce its error. The uncertainty for the frequency dependence determination, which is limited by the stability of a reference 1 pF cross capacitor, can be significantly reduced.

We evaluated a digital impedance bridge in a hybrid structure for comparison of a capacitor with a resistor where the impedance ratio was measured in two separate parts. The modulus of the impedance ratio was matched arbitrarily close to the input-to-output ratio, in magnitude, of a two-stage IVD by adjusting the operating frequency of the bridge; the residual deviation between the two together with the phase factor of the impedance ratio was measured using a custom detection system based on a four-channel 24-bit digitizer. The IVD was calibrated, in situ, using a four-arm bridge with two known capacitors. In contrast to the conventional approach of emphasizing precision and stability of the voltage sources driving the bridge, we adopted an approach that focused on the resolution and stability of the detectors. Fluctuations of the source voltages were largely removed through postprocessing of the digitized data, and the measurement results were limited by the digitizer error. While we have achieved a low Type A uncertainty (k=1) of 0.02 µF/F in 2 hours for determining the capacitance of a 100 pF capacitor relative to a 12906Ω resistor at 1233 Hz, the combined relative standard uncertainty (k=1) is 0.13 µF/F. Even though the uncertainty is not as low as for a conventional IVD-based double-quadrature bridge which has the modulus of the nominal impedance ratio equal to one, the digital bridge discussed here has a key advantage. The modulus of the nominal impedance ratio of the digital bridge is 100. This approach has the advantage of shortening the measurement chain from a 12906Ω resistor to a 100 pF capacitor by two 10:1 ratio steps.

The following items are incorporated by reference herein in their entirety:

F. Overney and B. Jeanneret, "Impedance bridges: from Wheatstone to Josephson," Metrologia, 55, S119-S134, 2018.

J. Kucera, T. Funck and J. Melcher, "Automated capacitance bridge for calibration of capacitors with nominal value from 10 nF up to 10 mF," Conf. on Precision Electromagnetic Measurements (IEEE), pp 596-596. 2012.

R. Rybski, J. Kaczmarek, and K. Kontorski, "Impedance comparison using unbalanced bridge with digital sine wave voltage sources," IEEE Trans. Instrum. Meas. 64 3380-6, 2015.

W. KOrten Ihlenfeld and R. Vasconcellos, "A digital four terminal-pair impedance bridge," Conf. on Precision Electromagnetic Measurements (IEEE) pp 1-2, 2016.

T. Souders, D. Flach, and J. Blair, "Step and frequency response testing of waveform recorders," Proc. IEEE Instrum. Meas. Technol. Conf. (IMTC), San Jose, CA, February 1990, pp. 214-220.

Cutkosky R D (1970) Techniques for comparing four-terminal-pair admittance standards. J. Res. Natl Bur. Stand. C 74C, 63

Kucera J et al. (2020) Characterization of a precision modular sinewave generator. Meas. Sci. Technol. 31, 064002 (9pp).

Wang Y, Schlamminger S, Waltrip B C, Berilla M (2020) Evaluation of a sampling impedance bridge. Conf. on Precision Electromagnetic Measurements (IEEE), pp 1-2.

Waltrip B C et al. (2009) AC Power Standard Using a Programmable Josephson Voltage Standard. IEEE Trans. Instr. Meas. 58(4): 1041-1048.

Jeffery A, Shields J, and Lee L (1996) Conversion of a 2-terminal-pair bridge to a 4-terminal-pair bridge for increased range and precision in impedance measurements. Proc. of 20th Biennial Conf. on Precision Electromagnetic Measurements (IEEE), pp 358-359.

Callegaro L, D'Elia V, Kampik M, Kim D B, Ortolano M and Pourdanesh F (2015) Experiences with a two-terminal pair digital impedance bridge. IEEE Trans. Instrum. Meas. 64 1460-5.

Elmholdt Christensen A (2019) A versatile electrical impedance calibration laboratory based on a digital impedance bridge. 19th International Congress of Metrology (CIM2019), p 11002.

Overney F and Jeanneret B (2011) RLC Bridge Based on an Automated Synchronous Sampling System. IEEE Trans. Instr. Meas. 60(7), pp 2393-2398.

Ramm G and Moser H (2005) New Multifrequency Method for the Determination of the Dissipation Factor of Capacitors and of the Time Constant of Resistors. IEEE Trans. Instr. Meas. 54(2), 521-524.

Small G W, Fiander J R and Coogan P C (2001) A bridge for the comparison of resistance with capacitance at frequencies from 200 Hz to 2 kHz. Metrologia, 38, 363-368.

Delahaye F and Goebel R (2005) Evaluation of the Frequency Dependence of the Resistance and Capacitance Standards in the BIPM Quadrature Bridge. IEEE Trans. Instr. Meas. 54(2), 533.

A. M. Thompson, "An absolute determination of resistance based on a calculable standard of capacitance," Metrologia, vol 4, pp. 1-7, January 1968.

R. D. Cutkosky, "Techniques for comparing four-terminal-pair admittance standards," Journal of Research of the National Bureau of Standards, vol. 74C, p. 63, 1970.

J. Schurr, V. Burkel, B. P. Kibble, "Realizing the farad from two ac quantum Hall resistances," Metrologia, vol. 46, pp. 619-628, October 2009.

F. Overney, N. E. Flowers-Jacobs, B. Jeanneret, A. Rifenacht, A. E, Fox, J. M. Underwood, A. D. Koffman, S. P. Benz, "Josephson-based full digital bridge for high-accuracy impedance comparisons," Metrologia, vol. 53, pp. 1045-1053, June 2016.

S. Bauer et al., "A four-terminal-pair Josephson impedance bridge combined with a graphene-quantized Hall resistance," Measurement Science and Technology, vol. 32, p. 065007, March 2021.

M. Marzano, M. Ortolano, V. D'Elia1, A. Müller, L. Callegaro, "A fully digital bridge towards the realization of the farad from the quantum Hall effect," Metrologia, vol. 58, p. 015002, 2021.

D. N. Homan, "Applications of coaxial chokes to A-C bridge circuits," Journal of Research of the National Bureau of Standards, vol. 72C, pp. 161-165, 1968.

IEEE Standard for Digitizing Waveform Recorders, IEEE Standard 1057-2017, January 2018.

P. Gournay et al., "Comparison CCEM-K4.2017 of 10 pF and 100 pF capacitance standards," Metrologia 56, 01001-01001, 2019.

Y. Wang, S. Shields, "Improved capacitance measurements with respect to a 1 pF cross-capacitor from 200 to 2000 Hz," IEEE Transactions on Instrumentation and Measurement 54, 542, 2005.

The processes described herein may be embodied in, and fully automated via, software code modules executed by a computing system that includes one or more general purpose computers or processors. The code modules may be stored in any type of non-transitory computer-readable medium or other computer storage device. Some or all the methods may alternatively be embodied in specialized computer hardware. In addition, the components referred to herein may be implemented in hardware, software, firmware, or a combination thereof.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

Any logical blocks, modules, and algorithm elements described or used in connection with the embodiments disclosed herein can be implemented as electronic hardware, computer software, or combinations of both. To clearly illustrate this interchangeability of hardware and software, various illustrative components, blocks, modules, and elements have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described or used in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, or algorithm described in connection with the embodiments disclosed herein can be embodied directly in hardware, in a software module stored in one or more memory devices and executed by one or more processors, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive, rather the elements can be used separately or can be combined together under appropriate circumstances.

What is claimed is:

1. A double-balance electronic test apparatus for measuring inductance, capacitance, and resistance, the double-balance electronic test apparatus comprising:
    a testing circuit that comprises:
        a testing ac waveform generator that produces a test waveform comprising a test phase P1 and a test amplitude A1;
        a testing ac waveform detector in electrical communication with the testing ac waveform generator and biased at test voltage V1 in operation; and
        the testing circuit receives an impedance device under test comprising a test impedance Z1, such that the impedance device under test is in electrical communication with the testing ac waveform generator, the testing ac waveform detector, and a virtual ground, and the impedance device under test receives the test waveform from the testing ac waveform generator, wherein the testing circuit produces a test current I1 that flows through the impedance device under test in response to the test impedance Z1 of the impedance device under test subjected to the test waveform;
    an auto balance circuit in electrical communication with the testing circuit and that comprises:
        a current amplifier in electrical communication with the virtual ground and that produces an auto balance current I2 based on a voltage of the virtual ground and produces an auto balance waveform comprising a auto balance phase P2 and an auto balance amplitude A2;
        an auto balance ac waveform detector in electrical communication with the current amplifier and biased at auto balance voltage V2 in operation; and
        an auto balance reference ac resistor comprising an auto balance impedance Z2 in electrical communication with the auto balance ac waveform detector, the current amplifier, and the virtual ground, such that the auto balance reference ac resistor receives the auto balance waveform from the current amplifier, wherein the auto balance circuit produces an auto balance current I2 that flows through the auto balance reference ac resistor in response to the auto balance impedance Z2 of the auto balance reference ac resistor subjected to the auto balance waveform; and
    a coarse balance circuit in electrical communication with the testing circuit, the auto balance circuit, and the virtual ground and that comprises:
        a coarse balance ac waveform generator that produces a coarse balance waveform comprising a coarse balance phase P3 and a coarse balance amplitude A3;
        a coarse balance ac waveform detector in electrical communication with the coarse balance ac waveform generator and biased at coarse balance voltage V3 in operation; and
        a coarse balance reference ac resistor comprising a coarse balance impedance Z3 in electrical communication with the coarse balance ac waveform detector, the coarse balance ac waveform generator, and the virtual ground, such that the coarse balance reference ac resistor receives the coarse balance waveform from the coarse balance ac waveform generator, wherein the coarse balance circuit produces an coarse balance current I3 that flows through the coarse balance reference ac resistor in response to the coarse balance impedance Z3 of the coarse balance reference ac resistor subjected to the coarse balance waveform.

2. The double-balance electronic test apparatus of claim 1, further comprising a synchronizer in electrical communication with the coarse balance circuit and the testing circuit.

3. The double-balance electronic test apparatus of claim 2, wherein:
    the testing ac waveform detector produces a test signal from the test voltage V1 across the test impedance Z1;
    the coarse balance ac waveform detector produces a coarse balance signal from the coarse balance voltage V3 across the coarse balance impedance Z3; and
    the synchronizer receives the test signal from the testing ac waveform detector and receives the coarse balance signal from the coarse balance ac waveform detector.

4. The double-balance electronic test apparatus of claim 3, wherein:
    the synchronizer produces a test synchronization signal from the test signal;
    the synchronizer produces a coarse balance synchronization signal from the coarse balance signal; and
    the synchronizer:
        adjusts the test amplitude A1 and the test phase P1 of the testing ac waveform generator with the test synchronization signal, and
        adjusts the coarse balance amplitude A3 and the coarse balance phase P3 of the coarse balance ac waveform generator with the coarse balance synchronization signal
to synchronize the testing ac waveform generator and the coarse balance ac waveform generator.

5. The double-balance electronic test apparatus of claim 4, wherein the coarse balance current I3 is approximately equal and opposite to the test current I1.

6. The double-balance electronic test apparatus of claim 1, wherein the coarse balance circuit further comprises a coarse balance inductive voltage divider in electrical communication with the coarse balance ac waveform generator, the coarse balance ac waveform detector, and the coarse balance reference ac resistor, and the coarse balance inductive voltage divider is electrically interposed between the coarse balance reference ac resistor and the coarse balance ac waveform detector.

7. The double-balance electronic test apparatus of claim 6, wherein the test voltage V1 and the coarse balance voltage V3 are approximately equal in magnitude.

8. The double-balance electronic test apparatus of claim 7, wherein the test voltage V1 and the coarse balance voltage V3 are approximately equal in magnitude in response to adjusting the output-to-input ratio of the coarse balance inductive voltage divider.

9. The double-balance electronic test apparatus of claim 6, wherein the detection response of the coarse balance ac waveform detector is linear as a result of the output-to-input ratio of the coarse balance inductive voltage divider.

10. The double-balance electronic test apparatus of claim 1, wherein an error current between the test current I1 and the coarse balance current I3 is auto-balanced by the auto balance current I2 produced by the auto balance circuit.

11. The double-balance electronic test apparatus of claim 1, wherein the virtual ground is maintained at the low terminal of the impedance device under test.

12. The double-balance electronic test apparatus of claim 1, wherein the coarse balance circuit reduces the auto balance current I2 from the current amplifier by approximately four orders of magnitude compared to operation of the double-balance electronic test apparatus in an absence of the coarse balance circuit.

13. The double-balance electronic test apparatus of claim 1, wherein the test current I1 is balanced by: the coarse balance current I3 through the coarse balance impedance Z3 and the auto balance current I2 through the auto balance impedance Z2.

14. The double-balance electronic test apparatus of claim 1, wherein the test current I1 is balanced by: the coarse balance current I3 through the coarse balance impedance Z3 and the auto balance current I2 through the auto balance impedance Z2, according to $$\frac{Z_3}{Z_1} = -\frac{V_3}{V_1} - \frac{Z_3}{Z_2}\frac{V_2}{V_1}.$$

15. A double-balance electronic test apparatus for measuring inductance, capacitance, and resistance, comprising:
a coarse balance inductive voltage divider that produces a reference voltage ratio;
a coarse balance circuit, digitally controlled through a feedback loop, for maintaining balance in the double-balance electronic test apparatus and comprising the coarse balance inductive voltage divider;
a current amplifier for achieving fine balance of the double-balance electronic test apparatus;
a synchronizer for synchronously sampling a test voltage V1 across a impedance device under test and a coarse balance voltage V3 across a coarse balance reference ac resistor to measure the residual deviation and phase factor of the impedance ratio of a coarse balance impedance Z3 of the coarse balance reference ac resistor to a test impedance Z1 of the impedance device under test;
a correlation analysis and source fluctuation suppression circuit for establishing the reference voltage ratio to calculate the impedance ratio;
wherein the modulus of the impedance ratio is matched arbitrarily close to the ratio of the coarse balance inductive voltage divider in magnitude, and the double-balance electronic test apparatus provides accurate measurements of the test impedance Z1 relative to coarse balance impedance Z3 with high precision and stability.

16. A double-balance electronic test apparatus for measuring inductance, capacitance, and resistance, comprising:
a coarse balance circuit, a testing circuit, and a auto balance circuit that measure the inductance, capacitance, and resistance of an impedance device under test, such that the measure of the inductance, capacitance, and resistance is more accurate than measurement with a single-balance LCR meter; and
the coarse balance circuit and the auto balance circuit are connected in parallel to the impedance device under test arranged in the testing circuit,
wherein the auto balance circuit measures an auto balance impedance Z2 of an auto balance reference ac resistor, the coarse balance circuit measures a coarse balance impedance Z3 of a coarse balance reference ac resistor, and the testing circuit measures a test impedance Z1 of the impedance device under test, such that an impedance ratio of the coarse balance impedance Z3 to the test impedance Z1 is determined by the difference between:
a ratio of a coarse balance voltage V3 to a test voltage V1; and
a product of:
a ratio of the coarse balance impedance Z3 to the auto balance impedance Z2; and
a ratio of an auto balance voltage V2 to the test voltage V1.

17. A process for measuring inductance, capacitance, and resistance, the process comprising:
providing a double-balance electronic test apparatus;
connecting an impedance device under test to the double-balance electronic test apparatus;
applying a test waveform to the impedance device under test;
measuring a test current I1 that flows through the impedance device under test;
using the measurement of the test current I1 to determine the test impedance Z1 of the impedance device under test;
comparing the test impedance Z1 of the impedance device under test to a coarse balance impedance Z3 provided by a coarse balance reference ac resistor; and
using the comparison to calculate the inductance, capacitance, and resistance of the impedance device under test.

* * * * *